United States Patent
Lin et al.

(10) Patent No.: US 9,425,286 B2
(45) Date of Patent: Aug. 23, 2016

(54) SOURCE/DRAIN STRESSOR HAVING ENHANCED CARRIER MOBILITY AND METHOD FOR MANUFACTURING SAME

(71) Applicant: Taiwan Semiconductor Manufacturing Company, Ltd., Hsin-Chu (TW)

(72) Inventors: Chin-Hsiang Lin, Hsinchu (TW); Jeff J. Xu, Jhubei (TW); Pang-Yen Tsai, Jhu-bei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 231 days.

(21) Appl. No.: 14/152,400

(22) Filed: Jan. 10, 2014

(65) Prior Publication Data

US 2014/0113424 A1  Apr. 24, 2014

Related U.S. Application Data

(62) Division of application No. 12/960,237, filed on Dec. 3, 2010, now Pat. No. 8,629,426.

(51) Int. Cl.
| | |
|---|---|
| *H01L 21/00* | (2006.01) |
| *H01L 29/66* | (2006.01) |
| *H01L 21/02* | (2006.01) |
| *H01L 29/78* | (2006.01) |

(52) U.S. Cl.
CPC ...... *H01L 29/66575* (2013.01); *H01L 21/0245* (2013.01); *H01L 21/0262* (2013.01); *H01L 21/02381* (2013.01); *H01L 21/02532* (2013.01); *H01L 21/02639* (2013.01); *H01L 29/66628* (2013.01); *H01L 29/66636* (2013.01); *H01L 29/7849* (2013.01)

(58) Field of Classification Search
CPC ............ H01L 29/66575; H01L 21/02381; H01L 21/02639
See application file for complete search history.

(56) References Cited

U.S. PATENT DOCUMENTS

| | | | | |
|---|---|---|---|---|
| 6,936,875 B2* | 8/2005 | Sugii | ................... | H01L 29/1054 257/288 |
| 7,045,401 B2* | 5/2006 | Lee | ...................... | H01L 29/1054 257/E29.056 |
| 7,112,495 B2* | 9/2006 | Ko | .................... | H01L 21/26506 257/E21.431 |
| 7,115,945 B2* | 10/2006 | Lee | ...................... | H01L 29/1054 257/190 |
| 7,375,385 B2* | 5/2008 | Westhoff | ................. | C30B 25/02 257/183 |
| 7,790,538 B2* | 9/2010 | Shang | ............. | H01L 21/823807 438/197 |
| 7,803,690 B2* | 9/2010 | Yu | .......................... | H01L 21/84 257/E21.546 |
| 7,829,442 B2* | 11/2010 | Westhoff | ................. | C30B 25/02 257/E21.125 |
| 7,928,474 B2* | 4/2011 | Lin | ................... | H01L 29/66553 257/190 |
| 8,049,277 B2* | 11/2011 | Yu | .......................... | H01L 21/84 257/347 |
| 8,080,833 B2* | 12/2011 | Grandusky | ........ | H01L 21/02389 257/103 |
| 8,129,747 B2* | 3/2012 | Westhoff | ................. | C30B 25/02 257/190 |
| 8,558,278 B2* | 10/2013 | Chuang | ........... | H01L 21/823807 257/190 |
| 8,962,400 B2* | 2/2015 | Tsai | ............... | H01L 21/823807 438/157 |
| 2004/0075105 A1* | 4/2004 | Leitz | ...................... | C30B 25/02 257/190 |
| 2004/0108559 A1* | 6/2004 | Sugii | ................... | H01L 29/1054 257/411 |

(Continued)

*Primary Examiner* — Laura Menz
(74) *Attorney, Agent, or Firm* — Haynes and Boone, LLP

(57) ABSTRACT

Various source/drain stressors that can enhance carrier mobility, and methods for manufacturing the same, are disclosed. An exemplary source/drain stressor includes a seed layer of a first material disposed over a substrate of a second material, the first material being different than the second material; a relaxed epitaxial layer disposed over the seed layer; and an epitaxial layer disposed over the relaxed epitaxial layer.

20 Claims, 22 Drawing Sheets

(56) References Cited

U.S. PATENT DOCUMENTS

| | | | |
|---|---|---|---|
| 2004/0173815 A1* | 9/2004 | Yeo | H01L 21/28194 257/192 |
| 2004/0178406 A1* | 9/2004 | Chu | H01L 21/02381 257/19 |
| 2004/0256647 A1* | 12/2004 | Lee | H01L 29/1054 257/289 |
| 2005/0156268 A1* | 7/2005 | Chu | H01L 21/02381 257/478 |
| 2005/0176204 A1* | 8/2005 | Langdo | H01L 21/02381 438/298 |
| 2005/0184345 A1* | 8/2005 | Lin | H01L 21/823412 257/375 |
| 2006/0009012 A1* | 1/2006 | Leitz | C30B 25/02 438/483 |
| 2006/0038199 A1* | 2/2006 | Lee | H01L 21/823807 257/192 |
| 2006/0113522 A1* | 6/2006 | Lee | H01L 29/1054 257/18 |
| 2006/0220119 A1* | 10/2006 | Lin | H01L 21/823412 257/336 |
| 2007/0298593 A1* | 12/2007 | Yu | H01L 21/84 438/479 |
| 2008/0079024 A1* | 4/2008 | Westhoff | C30B 25/02 257/200 |
| 2010/0301447 A1* | 12/2010 | Yu | H01L 21/84 257/506 |
| 2011/0012172 A1* | 1/2011 | Leitz | C30B 25/02 257/190 |
| 2012/0043641 A1* | 2/2012 | Yu | H01L 21/84 257/506 |
| 2012/0104461 A1* | 5/2012 | Leitz | C30B 25/02 257/190 |
| 2012/0138897 A1* | 6/2012 | Lin | H01L 21/02381 257/19 |
| 2014/0113424 A1* | 4/2014 | Lin | H01L 21/02381 438/300 |

* cited by examiner

SOURCE/DRAIN STRESSOR HAVING ENHANCED CARRIER MOBILITY AND METHOD FOR MANUFACTURING SAME

This is a divisional of U.S. Pat. No. 8,629,426, filed Dec. 3, 2010, which is incorporated herein by reference in its entirety for all purposes.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed. For example, as semiconductor devices, such as a metal-oxide-semiconductor field-effect transistors (MOSFETs), are scaled down through various technology nodes, strained source/drain features (stressors) have been implemented using epitaxial (epi) semiconductor materials to enhance carrier mobility and improve device performance. Forming a MOSFET with stressor regions often implements epitaxially grown silicon (Si) to form source and drain features for an n-type device, and epitaxially growing silicon germanium (SiGe) to form source and drain features for a p-type device. The epi Si features are often doped with carbon (C) to form Si:C features to further enhance carrier mobility. However, as device technology nodes continue to decrease, it has been observed that (1) traditional epi growth processes limit C solubility in Si epi features (for example, substitutional sites in Si epi are often less than 2%) and (2) incorporating C into the Si epi features tends to deactivate other dopants, such as phosphorous (P) and arsenic (As) (that may be used to form source and drain features, such as heavily doped source and drain features). Accordingly, although existing source/drain stressors and approaches for forming source/drain stressors have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
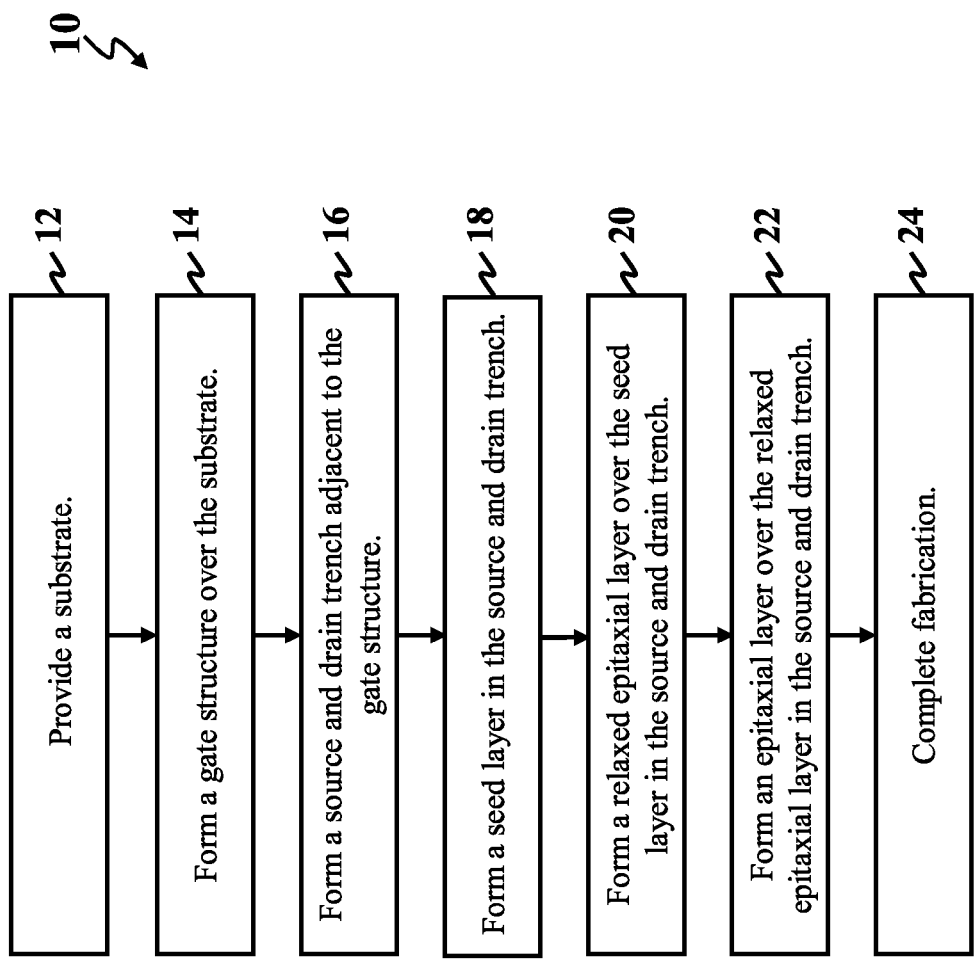
FIG. 1 is a flowchart of a method for fabricating an integrated circuit device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flow chart of a method 10 for fabricating an integrated circuit device according to various aspects of the present disclosure. The method 10 fabricates an integrated circuit device that includes a field-effect transistor (FET) device. The method 10 begins at block 12 where a substrate is provided. At block 14, a gate structure is formed over the substrate. At block 16, a source and drain trench is formed adjacent to the gate structure. At block 18, a seed layer is formed in the source and drain trench. The seed layer partially fills the source and drain trench. At block 20, a relaxed epitaxial layer is formed over the seed layer in the source and drain trench. The relaxed epitaxial layer partially fills the source and drain trench. And, at block 22, an epitaxial layer is formed over the relaxed epitaxial layer in the source and drain trench. The epitaxial layer fills the source and drain trench. The seed layer, relaxed epitaxial layer, and epitaxial layer form a source/drain stressor. The method 10 continues with block 24 where fabrication of the integrated circuit device is completed. Additional steps can be provided before, during, and after the method 10, and some of the steps described can be replaced or eliminated for other embodiments of the method. The discussion that follows illustrates various embodiments of integrated circuit devices having source/drain stressors that can be fabricated according to the method 10 of FIG. 1.

FIGS. 2-7 provide diagrammatic cross-sectional views of an integrated circuit device 100, in portion or entirety, at various stages of fabrication according to the method 10 of FIG. 1. The integrated circuit device 100 may be an integrated circuit chip, system on chip (SoC), or portion thereof, that includes various passive and active microelectronic devices such as resistors, capacitors, inductors, diodes, metal-oxide semiconductor field effect transistors (MOSFETs), complementary metal-oxide semiconductor (CMOS) transistors, high voltage transistors, high frequency transistors, other suitable components, or combinations thereof. In the depicted embodiment, the integrated circuit device 100 includes a field-effect transistor (FET) device, specifically an n-channel FET (NFET). Because the depicted integrated circuit device 100 includes an NFET, doping configurations described below should be read consistent with an NFET device. The integrated circuit device 100 may alternatively or additionally include a p-channel FET (PFET), in which case, the doping configurations described below should be read consistent with a PFET (for example, read with doping configurations having an opposite conductivity). FIGS. 2-7 have been simplified for the sake of clarity to better understand the inventive concepts of the present disclosure. Additional features can be added in the integrated circuit device 100, and some of the features described below can be replaced or eliminated in other embodiments of the integrated circuit device 100.

Figure 2:
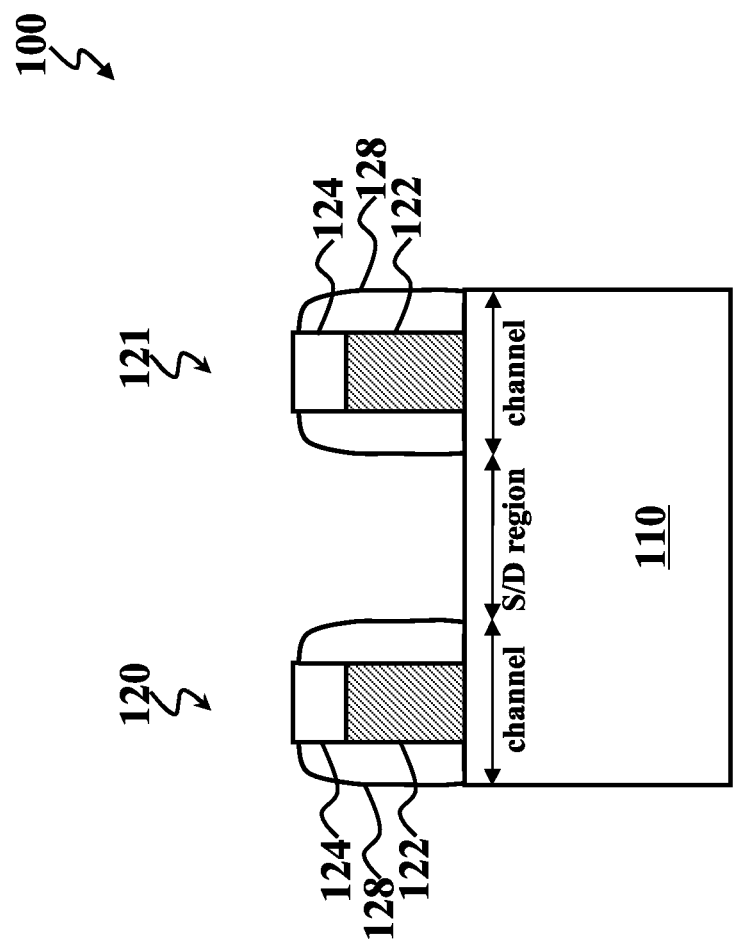
FIGS. 2-7 are diagrammatic cross-sectional views of an integrated circuit device at various fabrication stages according to the method of FIG. 1.

In FIG. 2, the integrated circuit device 100 includes a substrate (wafer) 110. In the depicted embodiment, the substrate 110 is a semiconductor substrate including silicon. Alternatively or additionally, the substrate 110 includes an elementary semiconductor, such as germanium; compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 110 is a semiconductor on insulator (SOI). In another alternative, semiconductor substrate 110 may include a doped epi layer, a gradient semiconductor layer, and/or a semiconductor layer overlying another semiconductor layer of a different type, such as a silicon layer on a silicon germanium layer. The substrate 110 may include various doped regions depending on design requirements as known in the art (e.g., p-type wells or n-type wells). The doped regions may be doped with p-type dopants, such as boron or $BF_2$; n-type dopants, such as phosphorus or arsenic; or a combination thereof. The doped regions may be formed directly on the substrate 110, in a P-well structure, in a N-well structure, in a dual-well structure, or using a raised structure. As noted above, the integrated circuit device 100 includes an NFET device. Accordingly, the substrate 110 may include doped regions configured for the NFET device.

Isolation features may be formed in the substrate 110 to isolate various regions of the substrate 110. The isolation features utilize isolation technology, such as local oxidation of silicon (LOCOS) and/or shallow trench isolation (STI), to define and electrically isolate the various regions. The isolation features comprise silicon oxide, silicon nitride, silicon oxynitride, other suitable materials, or combinations thereof. The isolation features may be formed by any suitable process. As one example, forming an STI includes a photolithography process, etching a trench in the substrate (for example, by using a dry etching and/or wet etching), and filling the trench (for example, by using a chemical vapor deposition process) with one or more dielectric materials. For example, the filled trench may have a multi-layer structure, such as a thermal oxide liner layer filled with silicon nitride or silicon oxide.

Gate structures 120 and 121 are disposed over the substrate 110. Though the depicted embodiment illustrates two gate structures 120 and 121, the integrated circuit device 100 may alternatively include a single gate structure or more than two gate structures disposed over the substrate 110. In the depicted embodiment, the gate structures 120 and 121 include a gate layer 122 and a hard mask layer 124. The gate layer 122 and hard mask layer 124 form gate stacks for the gate structures 120 and 121. In the depicted embodiment, the gate layer 122 includes a gate dielectric layer and a gate electrode (not separately illustrated). The gate dielectric layer includes a dielectric material, such as silicon oxide, high-k dielectric material, other suitable dielectric material, or combinations thereof. Examples of high-k dielectric material include $HfO_2$, HfSiO, HfSiON, HfTaO, HfSiO, HfZrO, zirconium oxide, aluminum oxide, hafnium dioxide-alumina ($HfO_2$—$Al_2O_3$) alloy, other suitable high-k dielectric materials, or combinations thereof. The gate electrode includes polysilicon and/or a metal including Al, Cu, Ti, Ta, W, Mo, TaN, NiSi, CoSi, TiN, WN, TiAl, TiAlN, TaCN, TaC, TaSiN, other conductive materials, or combinations thereof. The gate layer 122, such as the gate electrode, may be formed in a gate first or gate last process. The hard mask layer 124 is formed over the gate layer 122. The hard mask layer 124 includes silicon nitride, silicon oxynitride, silicon carbide, other suitable material, or combinations thereof. The hard mask layer 124 may have a multi-layer structure. The gate stack may include numerous other layers, for example, capping layers, interface layers, diffusion layers, barrier layers, or combinations thereof.

The gate structures 120 and 121 are formed by a suitable process, including deposition, lithography patterning, and etching processes. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. The lithography patterning processes include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography exposing process is implemented or replaced by other methods, such as maskless photolithography, electron-beam writing, or ion-beam writing. In yet another alternative, the lithography patterning process could implement nanoimprint technology. The etching processes include dry etching, wet etching, and/or other etching methods.

Spacers 128 are disposed on the sidewalls of the gate structures 120 and 121, such as along sidewalls of the gate layer 122 and hard mask layer 124. The spacers 128 include a dielectric material, such as silicon nitride, silicon oxynitride, other suitable material, or combinations thereof. The spacers may include a multi-layer structure, such as a multi-layer structure including a silicon nitride layer and a silicon oxide layer. The spacers are formed by a suitable process to a suitable thickness. For example, in the depicted embodiment, spacers 128 may be formed by depositing a silicon nitride layer and then dry etching the layer to form the spacers 128 as illustrated in FIG. 2.

The gate structures 120 and 121 interpose a source region and a drain region of the substrate 110, such that a channel is defined between the source region and the drain region. In the depicted embodiment, a single source and drain region (S/D region) is disposed adjacent to the gate structures 120 and 121. Though not depicted, it is understood that the gate structures 120 and 121 are adjacent to another S/D region, such that the channel is defined between two S/D regions. Before or after forming the spacers 128, implantation, diffusion, and/or annealing processes may be performed to form lightly doped source and drain (LDD) features in the S/D regions associated with the gate structures 120 and 121.

Figure 3:
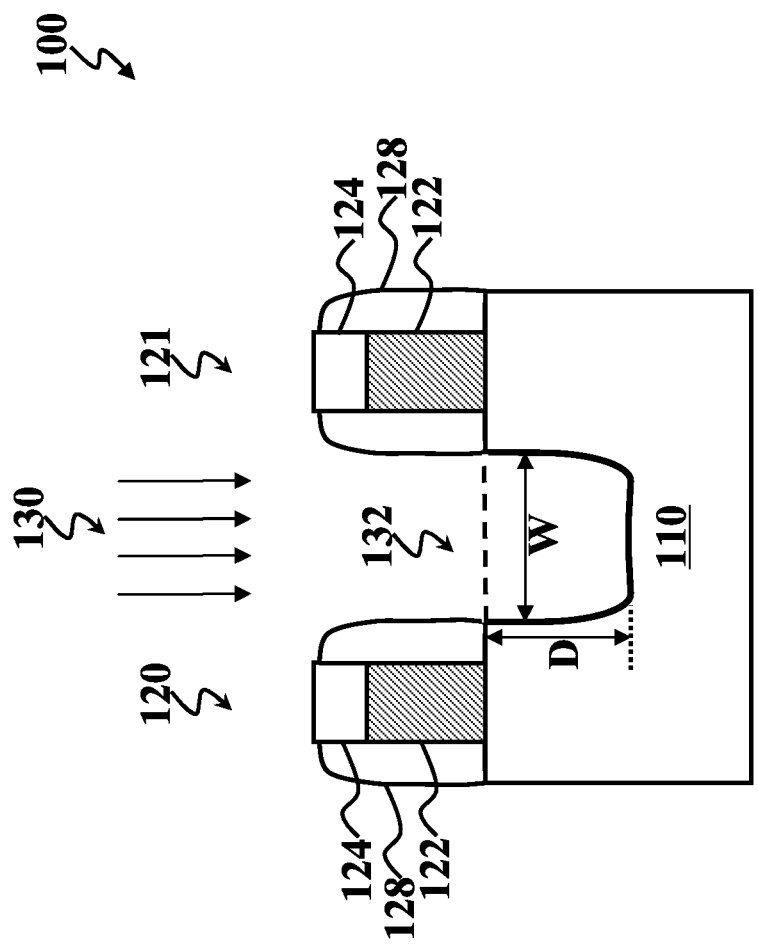

In FIG. 3, a process 130 is performed to form a recess (trench) 132 in the substrate 110. In the depicted embodiment, the process 130 is an etching process. The etching process is a dry etch, wet etch, other etching process, or combinations thereof. In the depicted embodiment, the trench 132 is formed between gate structures 120 and 121, in the associated S/D region of the gate structures 120 and 121. The trench has a depth, D, and a width, W. In the depicted embodiment, the depth, D, of the trench is about 50 nm to about 130 nm, and the width, W, is about 20 nm to about 60 nm.

Figure 4:
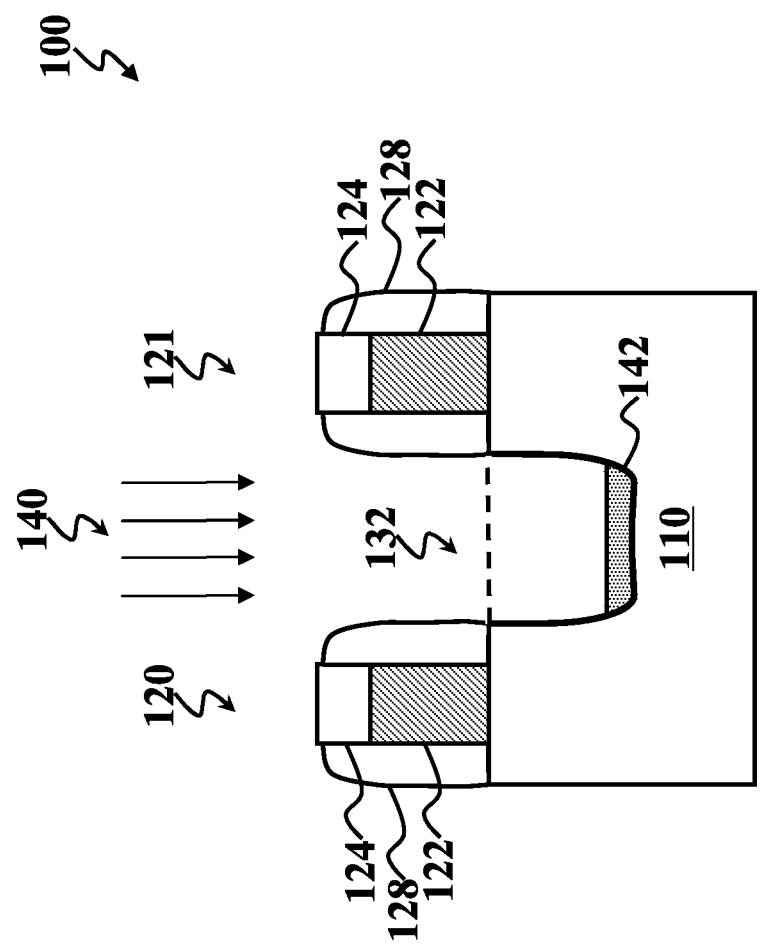

In FIG. 4, a growth process 140 forms a seed layer 142 over a bottom surface of the trench 132, thereby partially filling the trench 132. The seed layer 142 is a relatively thin layer, meaning the seed layer 142 has a thickness less than or equal to about 20 nm. In the depicted embodiment, the growth process 140 is tuned to form a silicon germanium layer having a high Ge concentration. For example, the seed layer 142 is a silicon germanium layer having a Ge concentration greater than or equal to about 40%. Various process parameters of the growth process 140 (such as precursor gas, carrier gas, flow rate of the precursor and/or carrier gas, growth time, growth temperature, chamber pressure, other suitable process parameters, or combinations thereof) may be tuned to achieve the silicon germanium layer having a Ge concentration greater than or equal to about 40%. For example, in the depicted embodiment, the growth process 140 uses a silicon-containing precursor gas, such as silane ($SiH_4$), disilane ($Si_2H_6$), trisilane ($Si_3H_8$), dichlorosilane (DCS) ($Si_2H_2Cl_2$), other suitable silicon-containing precursor gases, or combinations thereof; a germanium-containing precursor gas, such as germane ($GeH_4$), digermane ($Ge_2H_6$), germanium tetrachloride ($GeCl_4$), germanium dichloride ($GeCl_2$), other suitable germanium-containing precursor gases, or combinations thereof; and a carrier gas including He, $N_2$, $H_2$, Ar, other suitable carrier gases, or combinations thereof. In an example, forming the silicon germanium layer having a high Ge concentration includes using a DCS flow rate of about 30 sccm to about 100 sccm, a $GeH_4$ flow rate of about 200 sccm to about 900 sccm in an $H_2$ carrier gas, in a chamber pressure of about 1 Torr to about 80 Torr for about 30 seconds to about 300 seconds. Further, in the depicted embodiment, the growth process 140 is a low temperature process. For example, a growth temperature is about 530° C. to about 600° C. In an example, the growth process 140 is an epitaxial growth process, such that the seed layer 142 is an epitaxially grown silicon germanium layer having the high Ge concentration.

Figure 5:
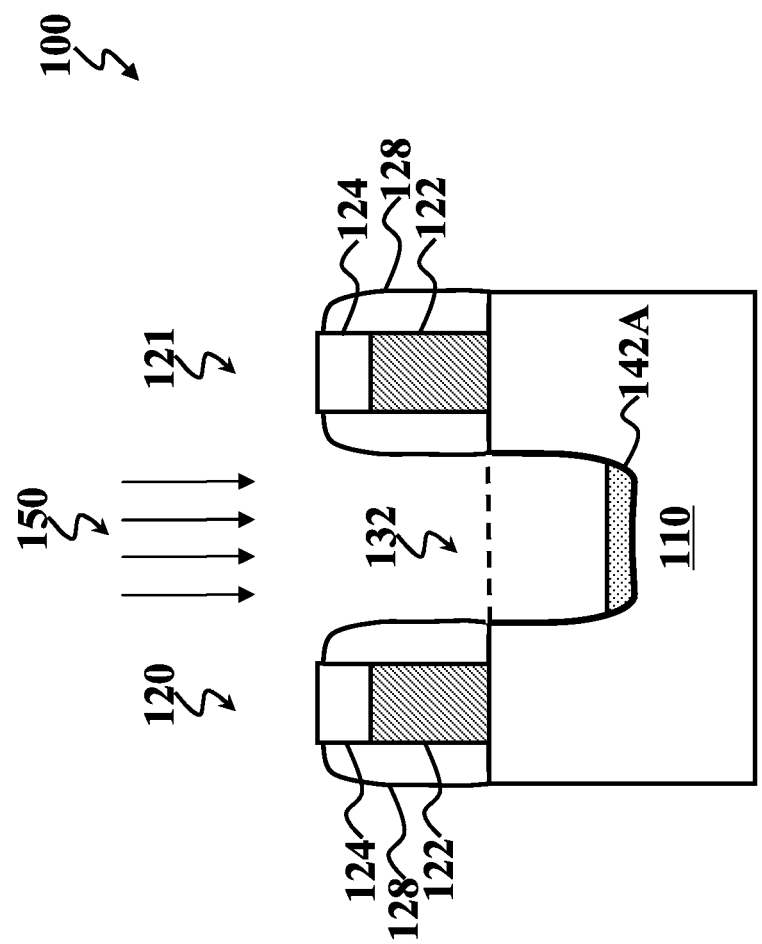

In FIG. 5, a process 150 is performed on the seed layer 142 to relax the seed layer 142, thereby forming relaxed seed layer 142A. In the depicted embodiment, the process 150 is a thermal annealing process that has process parameters tuned to relax the seed layer 142A. The process parameters can include annealing temperature, pressure, time, other suitable process parameters, and combinations thereof. For example, the seed layer 142 is annealed at a temperature of about 700° C. to about 850° C. in a chamber having a pressure of about 5 Torr to about 80 Torr for about 30 seconds to about two minutes. The process 150 is optional depending on the germanium concentration of the seed layer 142. For example, referring to FIG. 4, process 140 may be tuned so that the seed layer 142 is initially a relaxed layer (for example, when the seed layer 142 is a silicon germanium layer having a Ge concentration greater than or equal to about 50%), in which case the process 150 may be omitted. It should be noted that, generally, the initial process 140 forms seed layer 142 having a different lattice constant than the substrate 110. The seed layer 142 may be formed to an excess critical thickness and/or may be subjected to an annealing process (such as process 150) to enhance the lattice constant mismatch, thus relaxing seed layer 142 further, and in the depicted embodiment, providing relaxed seed layer 142A. For example, in the depicted embodiment, an average lattice constant of the relaxed seed layer 142A varies from an average lattice constant of the substrate 110 (in the depicted embodiment, a silicon substrate) by about 0.06 Å to about 0.20 Å depending on Ge concentration of the relaxed seed layer 142A. More specifically, the average lattice constant of the relaxed seed layer 142A is greater than the average lattice constant of the substrate 110 by about 0.068 Å to about 0.17 Å.

Figure 6:
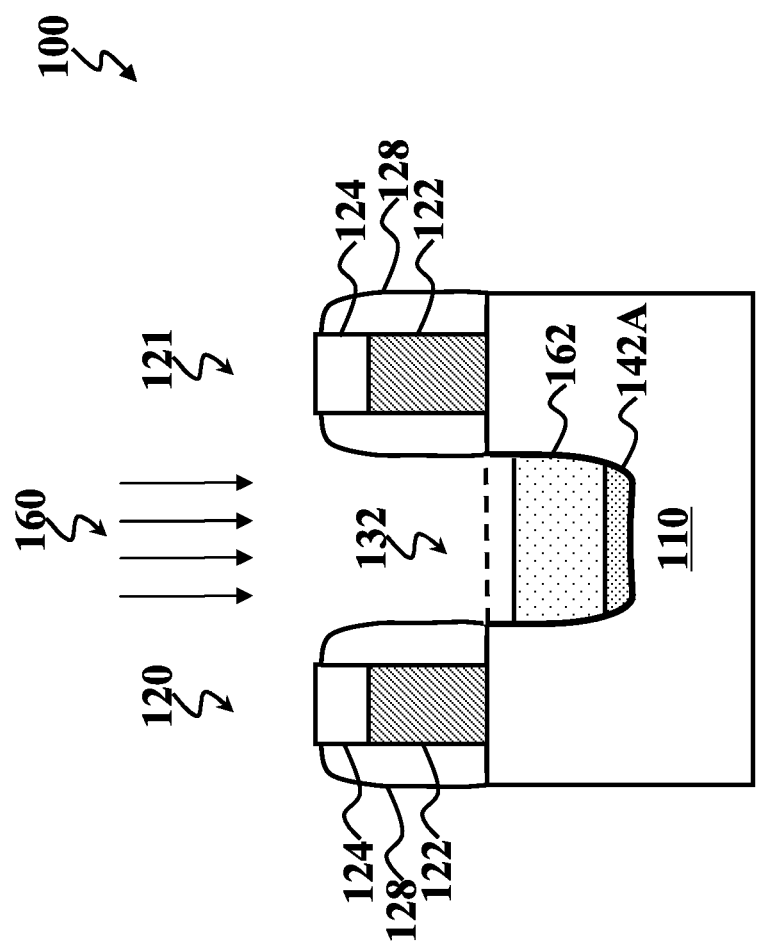

In FIG. 6, an epitaxial growth process 160 forms a relaxed epitaxial layer 162 over the relaxed seed layer 142A, thereby partially filling the trench 132. The relaxed epitaxial layer 162 has a thickness of about 40 nm to about 70 nm. In an example, the relaxed epitaxial layer 162 has a thickness of about 30 nm to about 50 nm. In the depicted embodiment, the relaxed epitaxial layer 162 is formed by an epitaxial process that is tuned to generate a silicon germanium layer having a lower Ge concentration than the relaxed seed layer 142A. For example, in the depicted embodiment, the relaxed epitaxial layer 162 is a layer having a Ge concentration that is at least 10% less than the relaxed seed layer 142A. In an example, the Ge concentration of the silicon germanium layer is about 20% to about 70%. The relaxed epitaxial layer 162 may have a gradient Ge doping concentration. For example, a Ge concentration at an interface of the relaxed epitaxial layer 162 and the relaxed seed layer 142A may be higher than a Ge concentration at a top surface of the relaxed epitaxial layer 162, where the Ge concentration gradually decreases from the interface to the top surface. In an example, the relaxed epitaxial layer 162 has a gradient Ge profile, where the Ge concentration ranges from 50% to 20%, with 50% Ge concentration at the relaxed epitaxial layer 162/relaxed seed layer 142A interface, and 20% Ge concentration at the top surface of the relaxed epitaxial layer 162.

The relaxed epitaxial layer 162 is formed by a selective epitaxial growth process, which may use CVD deposition techniques (e.g., LPCVD, APCVD, PECVD, vapor-phase epitaxy (VPE) and/or ultra-high vacuum CVD (UHV-CVD)), molecular beam epitaxy, other suitable techniques, or combinations thereof. The epitaxy process may use gaseous and/or liquid precursors. For example, in the depicted embodiment, a CVD epitaxial growth process uses a silicon-containing precursor gas, such as silane ($SiH_4$), disilane ($Si_2H_6$), trisilane ($Si_3H_8$), dichlorosilane (DCS) ($Si_2H_2Cl_2$), other suitable silicon-containing precursor gases, or combinations thereof; a germanium-containing precursor gas, such as germane ($GeH_4$), digermane ($Ge_2H_6$), germanium tetrachloride ($GeCl_4$), germanium dichloride ($GeCl_2$), other suitable germanium-containing precursor gases, or combinations thereof; and a carrier gas including He, $N_2$, $H_2$, Ar, other suitable carrier gases, or combinations thereof. In an example, forming the silicon germanium layer having the lower Ge concentration includes using a DCS flow rate of about 30 sccm to about 100 sccm, a $GeH_4$ flow rate of about 200 sccm to about 700 sccm in a $H_2$ carrier gas, in a chamber pressure of about 5 Torr to about 30 Torr for about 20 seconds to about 200 seconds. The relaxed epitaxial layer 162 is grown at a temperature higher than the temperature used in growth process 140. For example, epitaxial growth process 160 may use a growth temperature of about 630° C. to about 700° C.

Generally, the relaxed epitaxial layer 162 takes on the lattice structure and orientation (in other words, the lattice constant) of the relaxed seed layer 142A. However, since the relaxed epitaxial layer 162 has a lower Ge concentration than the relaxed seed layer 142A, the relaxed epitaxial layer 162 has a lattice constant different and lower than the relaxed seed layer 142A, while still remaining different and larger than the lattice constant of the substrate 110. For example, in the depicted embodiment, an average lattice constant of the relaxed epitaxial layer 162 varies from the average lattice constant of the substrate 110 (in the depicted embodiment, a silicon substrate) by about 0.04 Å to about 0.12 Å. More specifically, the average lattice constant of the relaxed epitaxial layer 162 is greater than the average lattice constant of the substrate 110 by about 0.04 Å to about 0.10 Å.

Figure 7:
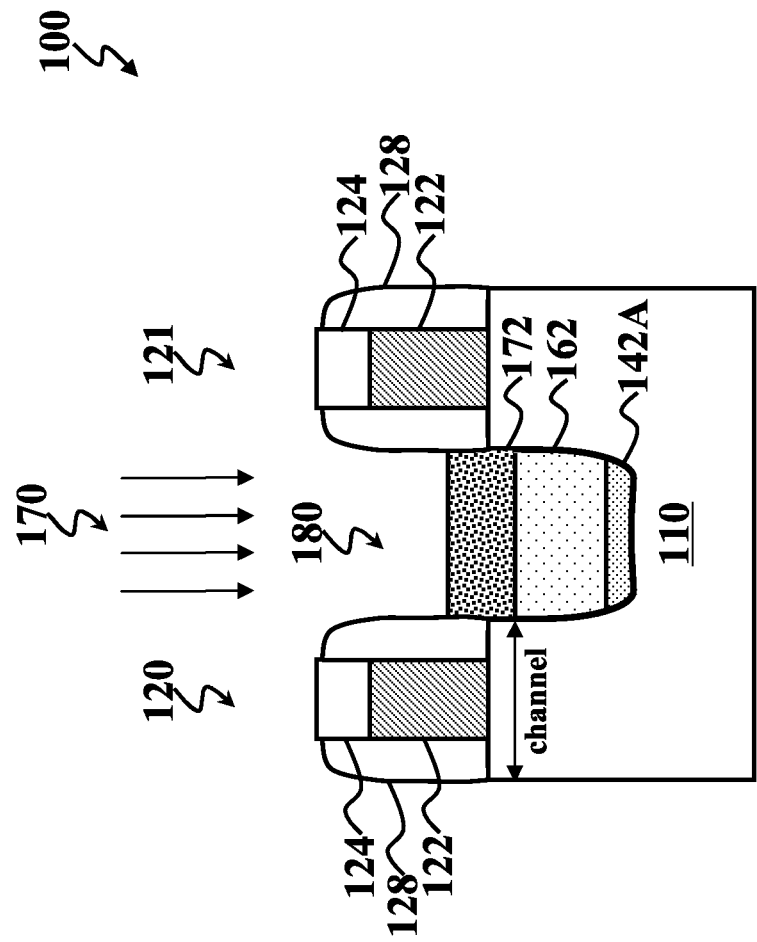

In FIG. 7, an epitaxial growth process 170 forms an epitaxial layer 172 over the relaxed epitaxial layer 162, thereby filling the trench 132. The epitaxial layer 172 has a thickness of about 40 nm to about 70 nm. In the depicted embodiment, the epitaxial growth process 170 is a selective epitaxial growth process, more specifically, a silicon-containing selective epitaxial growth process. Accordingly, the epitaxial layer 172 is a silicon-containing epitaxial layer. The selective epitaxial growth process may use CVD deposition techniques (e.g., LPCVD, APCVD, PECVD, vapor-phase epitaxy (VPE) and/or ultra-high vacuum CVD (UHV-CVD)), molecular beam epitaxy, other suitable techniques, or combinations thereof. The epitaxy process may use gaseous and/or liquid precursors. For example, a CVD epitaxial growth process may use a silicon-containing precursor gas, such as silane ($SiH_4$), disilane ($Si_2H_6$), trisilane ($Si_3H_8$), dichlorosilane (DCS) ($Si_2H_2Cl_2$), other suitable silicon-containing precursor gases, or combinations thereof; a phosphorus-containing precursor gas, such as phosphine ($PH_3$) and/or other suitable phosphorus-containing precursor gas; and a carrier gas including He, $N_2$, $H_2$, Ar, other suitable carrier gases, or combinations thereof. In an example, forming the silicon-containing epitaxial layer includes using a DCS flow rate of about 100 sccm to about 500 sccm and a $PH_3$ flow rate of about 200 sccm to about 1,000 sccm in an $H_2$ carrier gas, in a chamber pressure of about 5 Torr to about 40 Torr for about 300 seconds to about 1,500 seconds. The epitaxial growth process 170 uses a suitable growth temperature, such as a growth of about 600° C. to about 750° C.

Generally, epitaxial layer 172 takes on the lattice structure and orientation (in other words, the lattice constant) of the relaxed epitaxial layer 162. Accordingly, a lattice constant of the epitaxial layer 172 varies from the lattice constant of the substrate 110 (in the depicted embodiment, a silicon substrate) by about 0.04 Å to about 0.12 Å. More specifically, the average lattice constant of the epitaxial layer 172 is greater than the average lattice constant of the substrate 110 by about 0.04 Å to about 0.10 Å. Since an intrinsic lattice constant of the epitaxial layer 172 (in the depicted embodiment, the epitaxial silicon layer) is smaller than the actual lattice constant (taken from the underlying, virtual substrate (the relaxed epitaxial layer 162)) of the epitaxial layer 172, strain, specifically tensile strain, is induced in the epitaxial layer 172. The tensile strain of the epitaxial layer 172 thus induces tensile strain in the channel (in the silicon substrate 110), thereby enhancing electron mobility in the channel.

The relaxed seed layer 142A, relaxed epitaxial layer 162, and epitaxial layer 172 form a source and drain (S/D) stressor 180, which provides uniaxial stress to the NFET device. More specifically, by forming a "virtual substrate" (relaxed epitaxial layer 162) having a different lattice constant than the substrate (substrate 110), such that the epitaxial layer (epitaxial layer 172) has an intrinsically different lattice constant than its underlying virtual substrate (relaxed epitaxial layer 162), the S/D stressor 180 provides a tensile strained silicon layer (epitaxial layer 172) with a silicon substrate. In the depicted embodiment, the strain level can be enhanced by increasing the germanium concentration of the relaxed epitaxial layer 162 (the relaxed epitaxial silicon germanium layer), without solubility or dopant deactivation issues arising from conventional epitaxial silicon stressors doped with carbon (Si:C stressors). Because the S/D stressor 180 includes materials used in existing integrated circuit device fabrication processes, such as conventional CMOS processes, the process for forming the S/D stressor is easily implemented into existing fabrication processes. The S/D stressor 180 can also be applied in both planar and non-planar devices, such as a fin-like field-effect transistor (FinFET).

The integrated circuit device 100 may include additional features, which may be formed by subsequent processing. For example, implantation, diffusion, and/or annealing processes may be performed to form heavily doped source and drain (HDD) features in the source and drain regions, specifically in the S/D stressor 180. Silicide features may be formed in the source and drain regions, specifically on the S/D stressor 180. As noted, since the HDD features will be formed in the silicon and silicon germanium stressor, the dopants will not be deactivated. The silicide features may be formed by a silicidation process, such as a self-aligned silicide (salicide) process. Various contacts/vias/lines and multilayer interconnect features (e.g., metal layers and interlayer dielectrics) may be formed over the substrate 110, configured to connect the various features or structures of the integrated circuit device 100. The additional features may provide electrical interconnection to the device 100 including the gate structures 220 and 221. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

FIGS. 8-12 provide diagrammatic cross-sectional views of another integrated circuit device 200, in portion or entirety, at various stages of fabrication according to the method 10 of FIG. 1. The embodiment of FIGS. 8-12 is similar in many respects to the embodiment of FIGS. 2-7. For example, in the depicted embodiment, the integrated circuit device 200 includes an NFET. Accordingly, similar features in FIGS. 2-7 and 8-12 are identified by the same reference numerals for clarity and simplicity. FIGS. 8-12 have been simplified for the sake of clarity to better understand the inventive concepts of the present disclosure. Additional features can be added in the integrated circuit device 200, and some of the features described below can be replaced or eliminated in other embodiments of the integrated circuit device 200.

Figure 8:
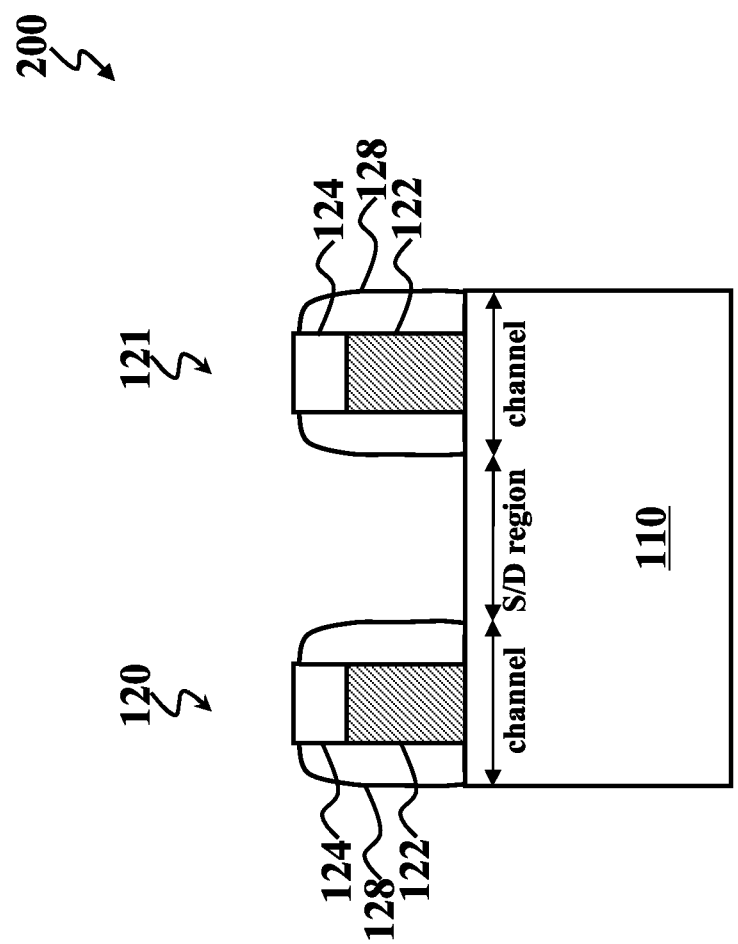
FIGS. 8-12 are diagrammatic cross-sectional views of another integrated circuit device at various fabrication stages according to the method of FIG. 1.
Figure 9:
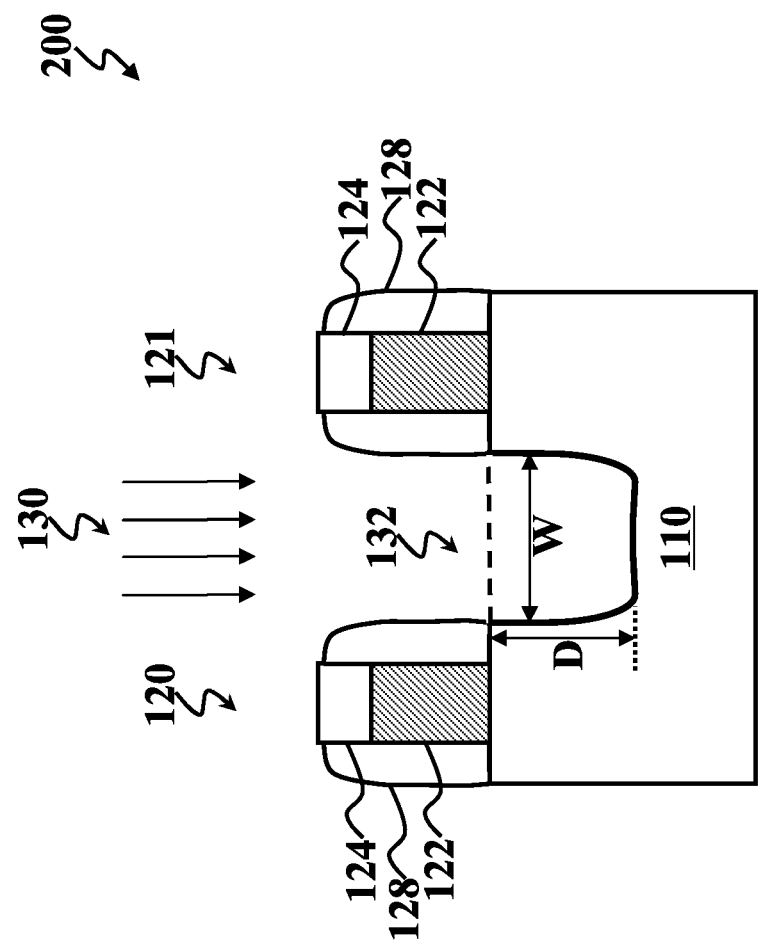

In FIGS. 8 and 9, the integrated circuit device 200 includes the substrate 110 having gate structures 120 and 121 disposed thereover. The gate structures 120 and 121 interpose S/D regions, defining the channel therebetween. The gate structures 120 and 121 each include the gate layer 122, hard mask layer 124, and spacers 128. And, the process 130 forms the trench 132 (having depth, D, and width, W) in the S/D region of the substrate, adjacent to and associated with the gate structures 120 and 121.

Figure 10:
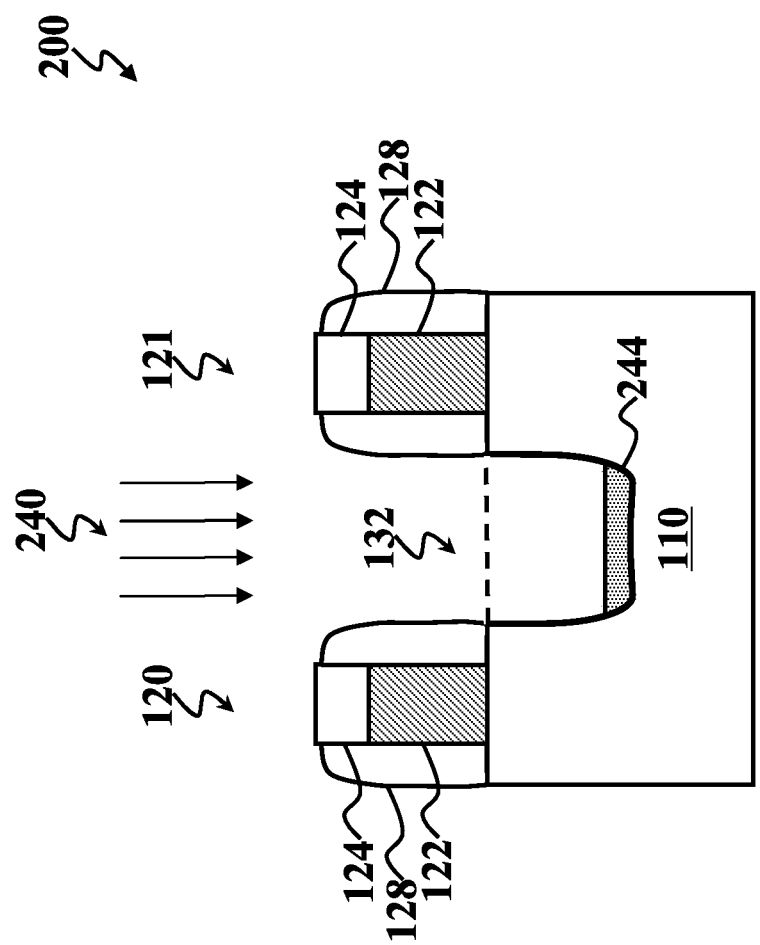

In FIG. 10, a growth process 240 forms a seed layer 244 over a bottom surface of the trench 132, thereby partially filling the trench 132. The seed layer 244 is a relatively thin layer, meaning the seed layer 244 has a thickness less than or equal to about 20 nm. In the depicted embodiment, the growth process 240 is tuned to form a silicon carbon layer that will cause relaxation in the later-grown epitaxial layer 162. For example, the seed layer 244 is a silicon carbon layer having a carbon (C) concentration greater than or equal to 0.5%. In the depicted embodiment, the seed layer 244 is a silicon carbon layer having a carbon concentration of about 2% to about 5%. Various process parameters of the growth process 240 (such as precursor gas, carrier gas, flow rate of the precursor and/or carrier gas, growth time, growth temperature, chamber pressure, other suitable process parameters, or combinations thereof) may be tuned to achieve the relaxed silicon carbon layer. For example, in the depicted embodiment, the growth process 240 uses a silicon-containing precursor gas, such as silane ($SiH_4$), disilane ($Si_2H_6$), trisilane ($Si_3H_8$), dichlorosilane (DCS) ($Si_2H_2Cl_2$), other suitable silicon-containing precursor gases, or combinations thereof; a carbon-containing precursor gas, such as methane ($CH_4$), monomethylsilane ($SiH_3(CH_3)$) (MMS), other suitable carbon-containing precursor gases, or combinations thereof; and a carrier gas including He, $N_2$, $H_2$, Ar, other suitable carrier gases, or combinations thereof. In an example, forming the silicon carbon layer includes using a MMS flow rate of about 50 sccm to about 500 sccm and a $Si_3H_8$ flow rate of about 50 sccm to about 300 sccm in an $H_2$ carrier gas, in a chamber pressure of about 10 Torr to about 300 Torr for about 1 second to about 100 seconds. Further, in the depicted embodiment, the growth process 240 uses a suitable growth temperature, for example, a growth temperature of about 530° C. to about 600° C.

The seed layer 244 has a different lattice constant than the substrate 110, thereby creating a lattice mismatch between the substrate 110 and seed layer 244. For example, in the depicted embodiment, an average lattice constant of the seed layer 244 varies from an average lattice constant of the substrate 110 (in the depicted embodiment, a silicon substrate) by about 0.04 Å to about 0.20 Å. More specifically, the average lattice constant of the seed layer 244 is less than the average lattice constant of the substrate 110 by about 0.06 Å to about 0.15 Å. In the depicted embodiment, the growth process 240 alone provides a silicon carbon layer that ensures relaxation in the later-grown epitaxial layer 162. Alternatively, an annealing process, such as a thermal anneal process, may be implemented to tune the seed layer 244, such that a suitable seed layer is achieved. For example, where the seed layer 244 is a silicon carbon layer having a carbon concentration less than or equal to 1.5%, the annealing process may be performed to the seed layer 244.

Figure 11:
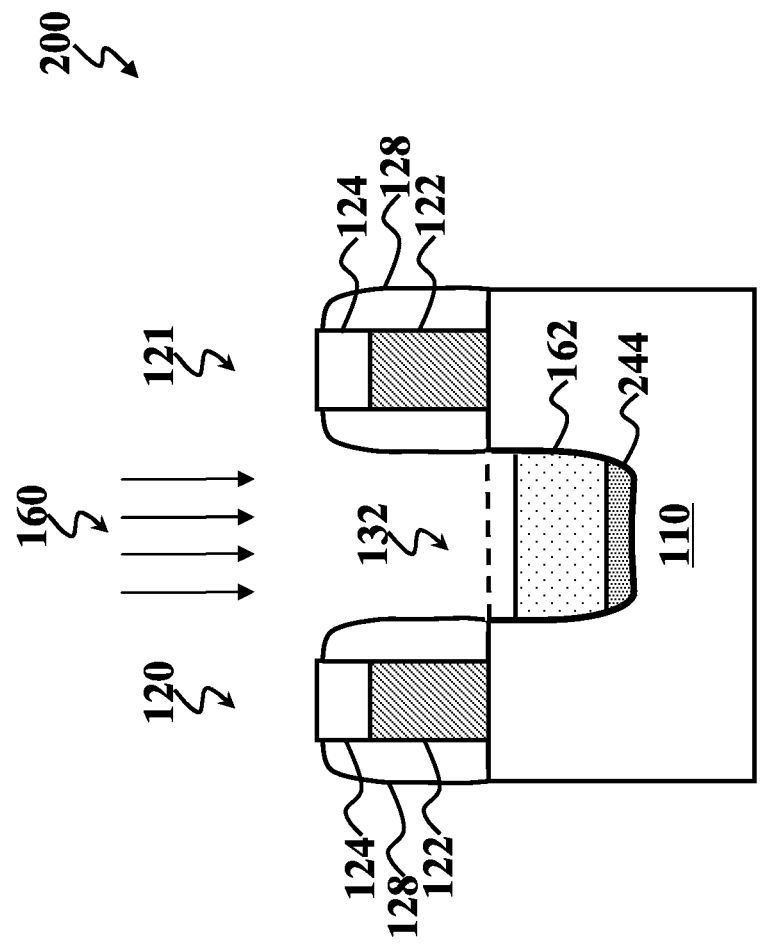

In FIG. 11, the epitaxial growth process 160 forms the relaxed epitaxial layer 162 over the seed layer 244, thereby partially filling the trench 132. Generally, the relaxed epitaxial layer 162 takes on the lattice structure and orientation (in other words, the lattice constant) of the seed layer 244. However, in the depicted embodiment, since the epitaxial layer 162 is silicon germanium, and the seed layer 244 is silicon carbon, stress between the two layers is so great that the epitaxial layer 162 substantially retains its intrinsic lattice constant, causing a lattice mismatch between the epitaxial layer 162 and the seed layer 244. The large lattice mismatch ensures that the epitaxial layer 162 is in a relaxed state, and thus, provides the relaxed epitaxial layer 162. A lattice constant of the relaxed epitaxial layer 162 is different than the lattice constant of the substrate 110. For example, in the depicted embodiment, an average lattice constant of the relaxed epitaxial layer 162 varies from an average lattice constant of the substrate 110 (in the depicted embodiment, a silicon substrate) by about 0.04 Å to about 0.12 Å. More specifically, the average lattice constant of the relaxed epitaxial layer 162 is greater than the average lattice constant of the substrate 110 by about 0.04 Å to about 0.10 Å.

Figure 12:
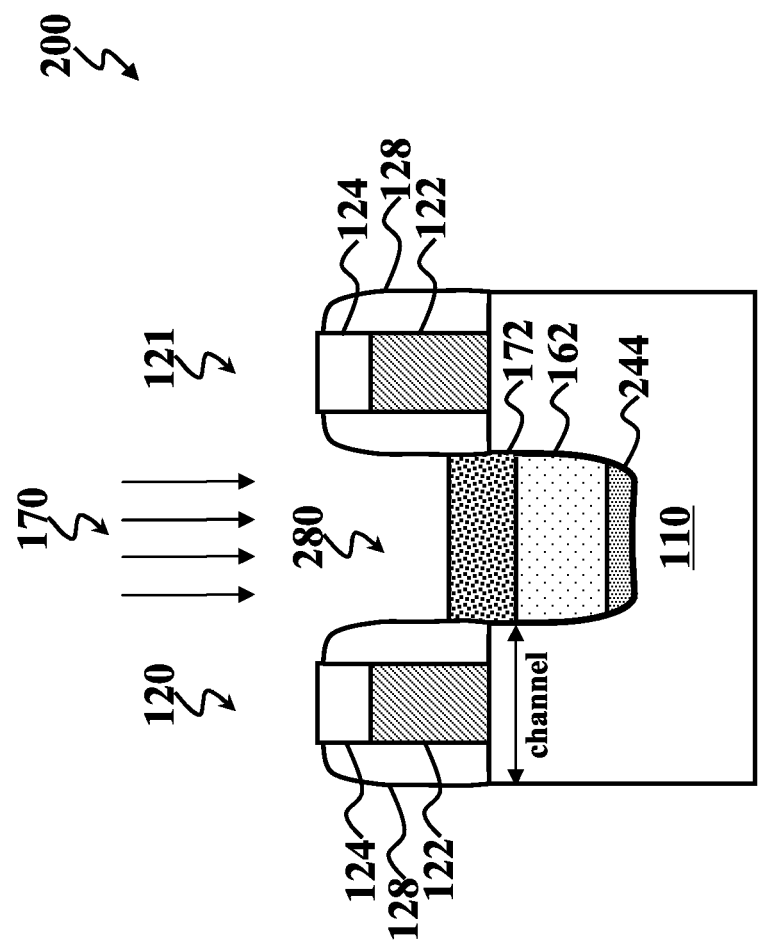

In FIG. 12, the epitaxial growth process 170 forms the epitaxial layer 172 over the relaxed epitaxial layer 162, thereby filling the trench 132. Generally, epitaxial layer 172 takes on the lattice structure and orientation (in other words, the lattice constant) of the relaxed epitaxial layer 162. Accordingly, a lattice constant of the epitaxial layer 172 varies from the lattice constant of the substrate 110 (in the depicted embodiment, a silicon substrate) by about 0.04 Å to about 0.12 Å. More specifically, the average lattice constant of the epitaxial layer 172 is greater than the average lattice constant of the substrate 110 by about 0.04 Å to about 0.10 Å. Since an intrinsic lattice constant of the epitaxial layer 172 (in the depicted embodiment, the epitaxial silicon layer) is smaller than its actual lattice constant (taken from the underlying, virtual substrate (the relaxed epitaxial layer 162)) of the epitaxial layer 172, strain, specifically tensile strain, is induced in the epitaxial layer 172. The tensile strain of the epitaxial layer 172 induces tensile strain in the channel (in the silicon substrate 110), thereby enhancing electron mobility in the channel.

The seed layer 244, relaxed epitaxial layer 162, and epitaxial layer 172 form a source and drain (S/D) stressor 280, which provides uniaxial stress to the NFET device. More specifically, by forming a "virtual substrate" (relaxed epitaxial layer 162) having a different lattice constant than the substrate (substrate 110), such that the epitaxial layer (epitaxial layer 172) has an intrinsically different lattice constant than its underlying virtual substrate (relaxed epitaxial layer 162), the S/D stressor 280 provides a tensile strained silicon layer (epitaxial layer 172) with a silicon substrate. In the depicted embodiment, the strain level can be enhanced by increasing the germanium concentration of the relaxed epitaxial layer 162 (the relaxed epitaxial silicon germanium layer (or virtual substrate)), without solubility or dopant deactivation issues arising from conventional epitaxial silicon stressors doped with carbon (Si:C stressors). Because the S/D stressor 280 includes materials used in existing integrated circuit device fabrication process, such as conventional CMOS processes, the process for forming the S/D stressor is easily implemented into existing fabrication processes. The S/D stressor 280 can also be applied in both planar and non-planar devices, such as a FinFET.

The integrated circuit device 200 may include additional features, which may be formed by subsequent processing. For example, implantation, diffusion, and/or annealing processes may be performed to form heavily doped source and drain (HDD) features in the source and drain regions, specifically in the S/D stressor 280. Silicide features may be formed in the source and drain regions, specifically on the S/D stressor 280. The silicide features may be formed by a silicidation process, such as a self-aligned silicide (salicide) process. Various contacts/vias/lines and multilayer interconnect features (e.g., metal layers and interlayer dielectrics) may be formed over the substrate 110, configured to connect the various features or structures of the integrated circuit device 200. The additional features may provide electrical interconnection to the device 200 including the gate structures 220 and 221. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

FIGS. 13-17 provide diagrammatic cross-sectional views of yet another integrated circuit device 300, in portion or entirety, at various stages of fabrication according to the method 10 of FIG. 1. The embodiment of FIGS. 13-17 is similar in many respects to the embodiment of FIGS. 2-7. For example, in the depicted embodiment, the integrated circuit device 300 includes an NFET. Accordingly, similar features in FIGS. 2-7 and 13-17 are identified by the same reference numerals for clarity and simplicity. FIGS. 13-17 have been simplified for the sake of clarity to better understand the inventive concepts of the present disclosure. Additional features can be added in the integrated circuit device 300, and some of the features described below can be replaced or eliminated in other embodiments of the integrated circuit device 300.

Figure 13:
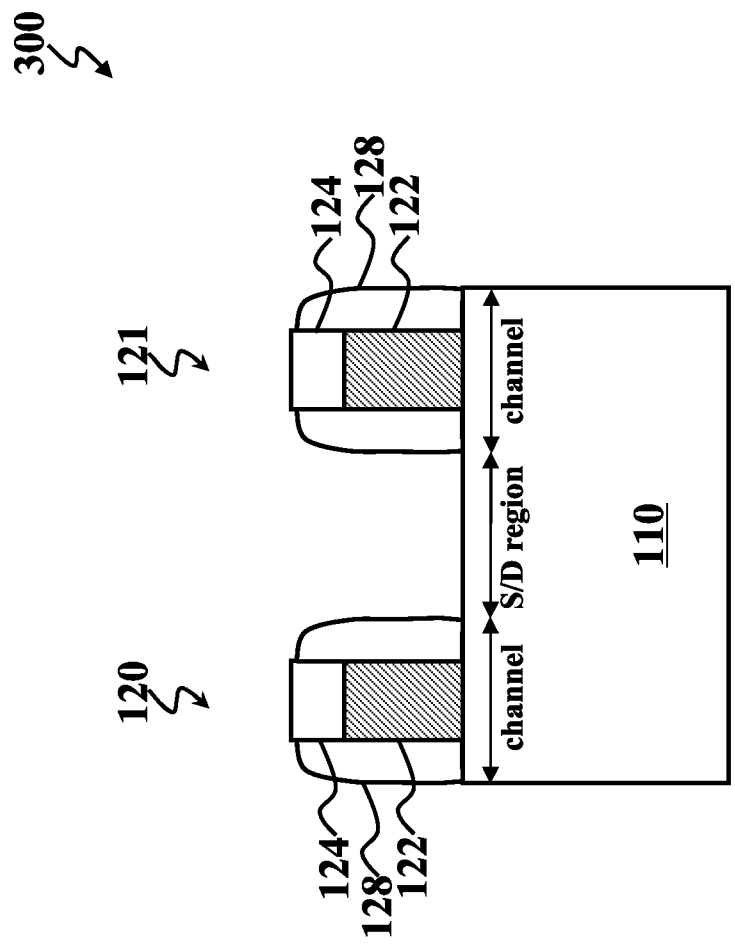
FIGS. 13-17 are diagrammatic cross-sectional views of yet another integrated circuit device at various fabrication stages according to the method of FIG. 1.
Figure 14:
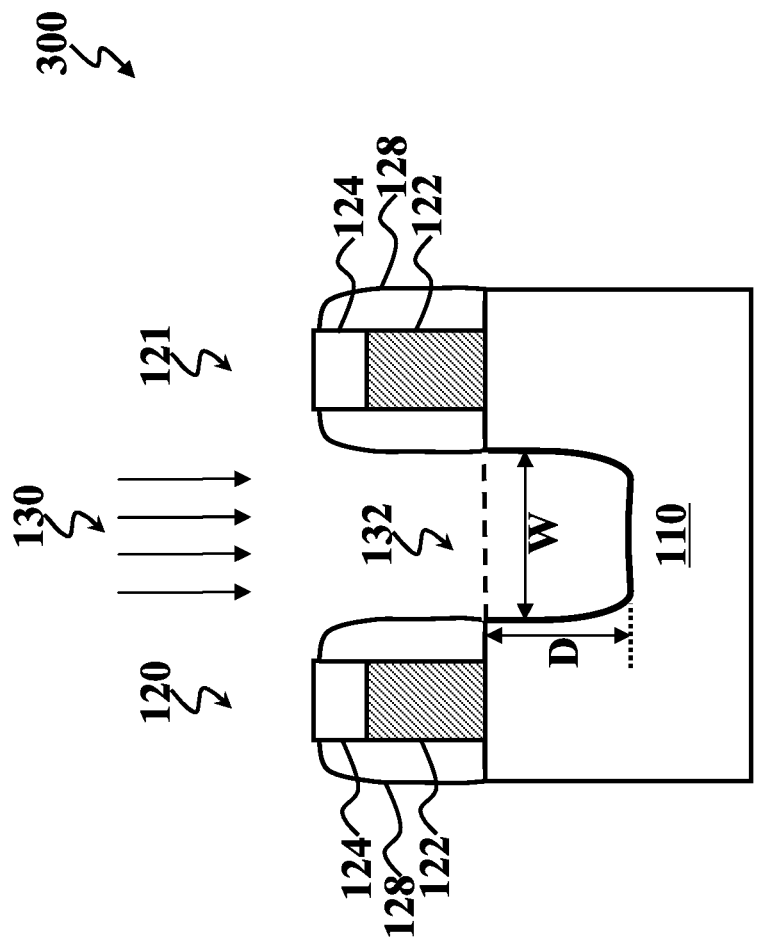

In FIGS. 13 and 14, the integrated circuit device 300 includes the substrate 110 having gate structures 120 and 121 disposed thereover. The gate structures 120 and 121 interpose S/D regions, defining the channel therebetween. The gate structures 120 and 121 each include the gate layer 122, hard mask layer 124, and spacers 128. And, the process 130 forms the trench 132 (having depth, D, and width, W) in the S/D region of the substrate 110, adjacent to and associated with the gate structures 120 and 121.

Figure 15:
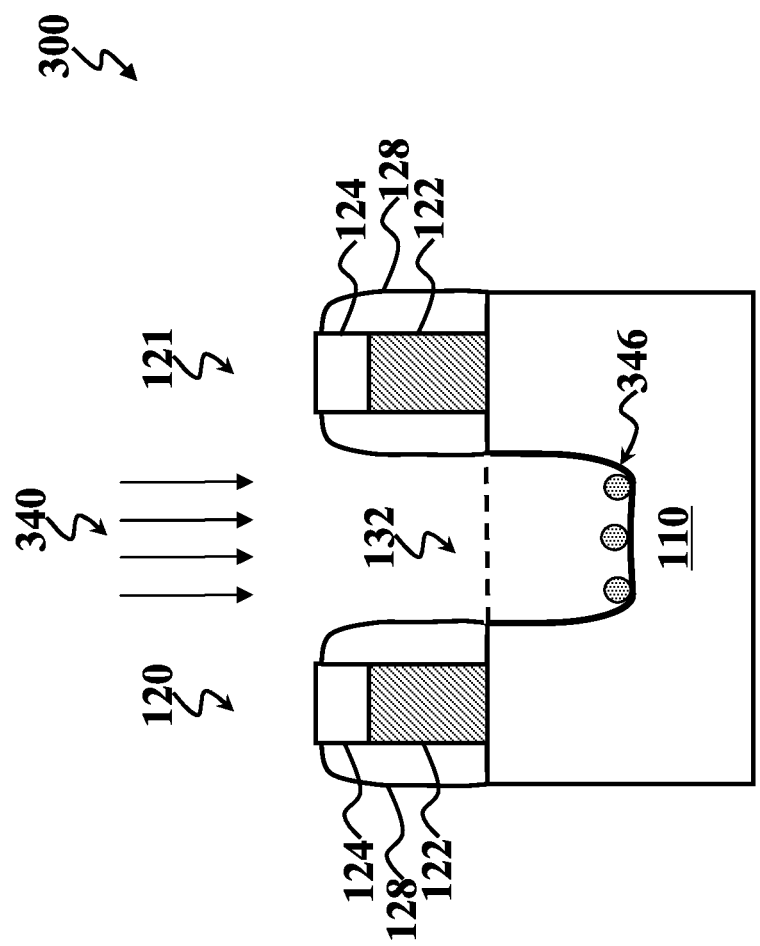

In FIG. 15, a growth process 340 forms a seed layer 346 over a bottom surface of the trench 132, thereby partially filling the trench 132. The seed layer 346 is a relatively thin layer, meaning the seed layer 346 has a thickness less than or equal to about 20 nm. More specifically, the seed layer 346 has a thickness of about 3 nm to about 5 nm. In the depicted embodiment, the growth process 340 is tuned to form a carbon coherence breaking layer. The carbon coherence breaking layer is a layer of C—C discrete clusters formed along the bottom surface of the trench. As will be discussed further below, the C—C discrete clusters disturb coherence between the substrate 110 and later-deposited epitaxial layer, such as relaxed epitaxial layer 162. Various process parameters of the growth process 340 (such as precursor gas, carrier gas, flow rate of the precursor and/or carrier gas, growth time, growth temperature, chamber pressure, other suitable process parameters, or combinations thereof) may be tuned to achieve the carbon coherence breaking layer. For example, in the depicted embodiment, the growth process 340 uses a carbon-containing precursor gas, such as methane ($CH_4$), monomethylsilane ($SiH_3(CH_3)$) (MMS), other suitable carbon-containing precursor gas, or combinations thereof; and a carrier gas including $N_2$, $H_2$, Ar, other suitable carrier gas, or combinations thereof. In an example, forming the carbon coherence breaking layer includes using a MMS flow rate of about 50 sccm to about 500 sccm in an $H_2$ carrier gas, in a chamber pressure of about 10 Torr to about 300 Torr for about 1 second to about 50 seconds. Further, in the depicted embodiment, the growth process 340 uses a suitable growth temperature, for example, a growth temperature of about 300° C. to about 600° C.

The seed layer 346 has a different lattice constant than the substrate 110, thereby creating a lattice mismatch between the substrate 110 and seed layer 346. For example, in the depicted embodiment, an average lattice constant of the seed layer 346 varies from an average lattice constant of the substrate 110 (in the depicted embodiment, a silicon substrate) by about 0.04 Å to about 0.20 Å. More specifically, the average lattice constant of the seed layer 346 is less than the average lattice constant of the substrate 110 by about 0.06 Å to about 0.15 Å. In the depicted embodiment, the growth process 340 alone forms the a carbon coherence breaking layer that sufficiently forms sufficient C—C cluster defects at the bottom of the trench 132, such that bonding conherence between the substrate 110 and later-formed epitaxial layer 162 is reduced. Optionally, an annealing process, such as a thermal anneal process, may be implemented to increase the C—C discrete clusters, further enhancing incoherence between the substrate 110 and later-formed epitaxial layer 162. For example, the seed layer 346 is annealed at a temperature of about 500° C. to about 750° C. in a chamber having a pressure of about 5 Torr to about 100 Torr for about 30 seconds to about 60 minutes.

Figure 16:
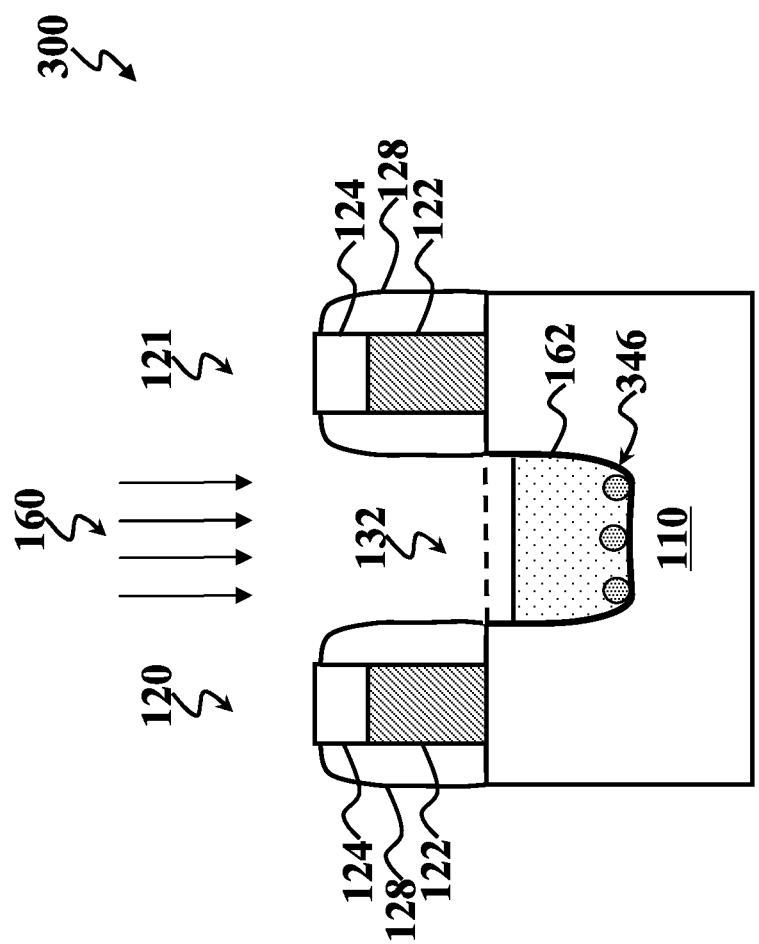

In FIG. 16, the epitaxial growth process 160 forms the relaxed epitaxial layer 162 over the seed layer 346, thereby partially filling the trench 132. Generally, the relaxed epitaxial layer 162 takes on the lattice structure and orientation (in other words, the lattice constant) of the seed layer 346. However, in the depicted embodiment, the carbon coherence breaking seed layer 346 prevents the epitaxial layer 162 from bonding adequately with the substrate 110, thus preventing the epitaxial layer 162 from taking on the lattice structure and orientation of the substrate 110. Further, since the epitaxial layer 162 is silicon germanium, and the seed layer 346 is carbon, stress between the two layers is so great that the epitaxial layer 162 substantially retains its intrinsic lattice constant, causing a lattice mismatch between the epitaxial layer 162 and the seed layer 346. The large lattice mismatch ensures that the epitaxial layer 162 is in a relaxed state, and thus, provides the relaxed epitaxial layer 162. A lattice constant of the relaxed epitaxial layer 162 is different than the lattice constant of the substrate 110. For example, in the depicted embodiment, an average lattice constant of the relaxed epitaxial layer 162 varies from an average lattice constant of the substrate 110 (in the depicted embodiment, a silicon substrate) by about 0.04 Å to about 0.12 Å. More specifically, the average lattice constant of the relaxed epitaxial layer 162 is greater than the average lattice constant of the substrate 110 by about 0.04 Å to about 0.10 Å.

Figure 17:
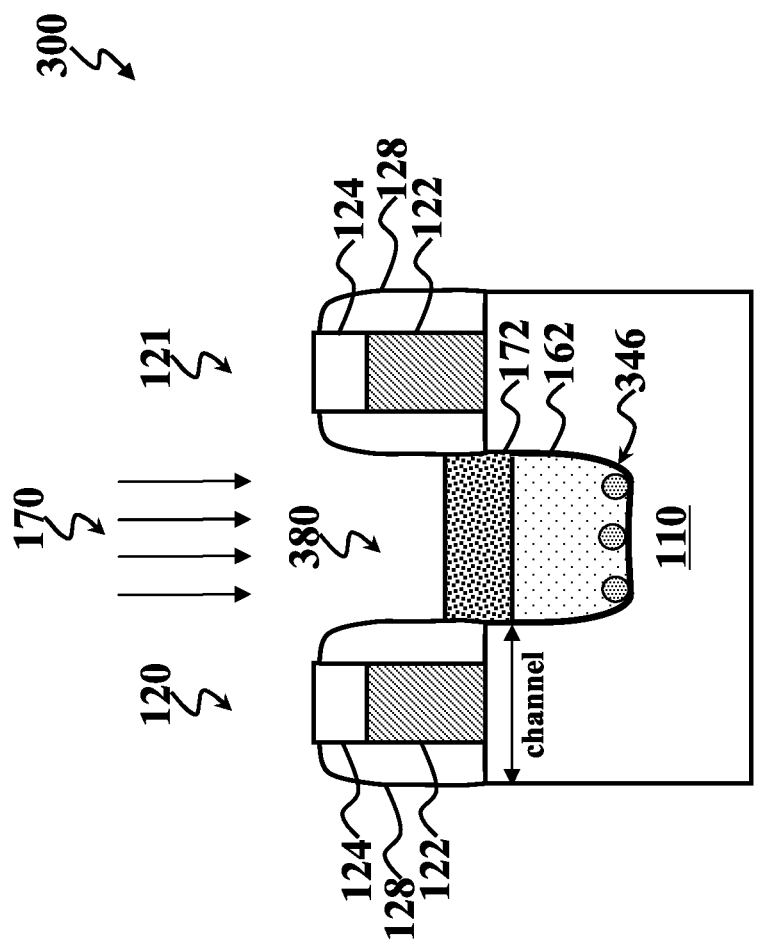
Figure 18:
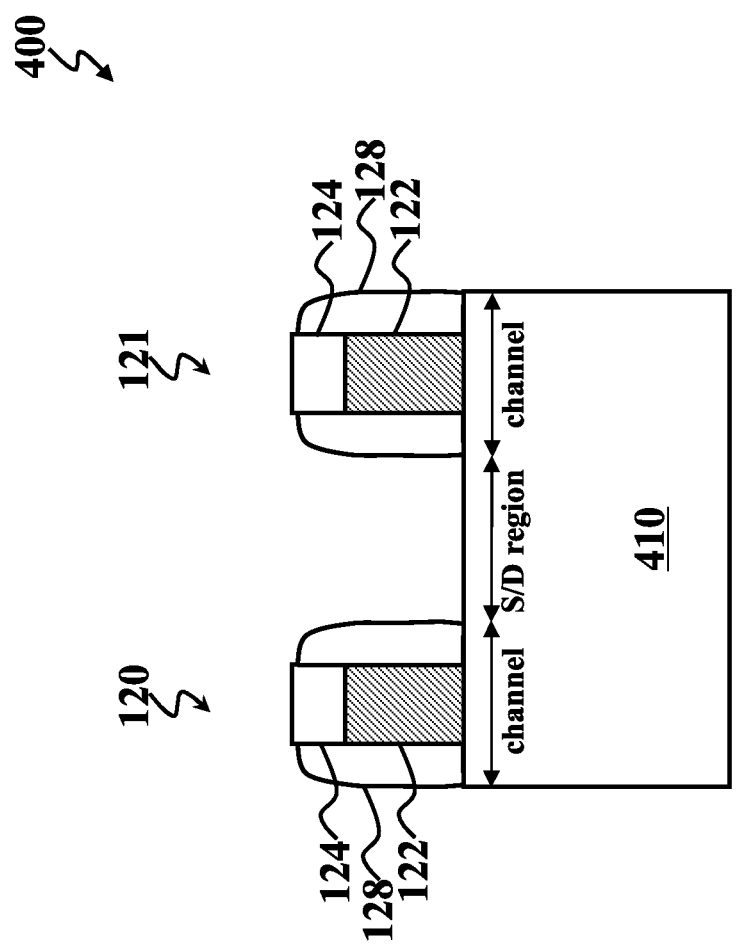
FIGS. 18-22 are diagrammatic cross-sectional views of yet another integrated circuit device at various fabrication stages according to the method of FIG. 1.

In FIG. 17, the epitaxial growth process 170 forms the epitaxial layer 172 over the relaxed epitaxial layer 162, thereby filling the trench 132. Generally, epitaxial layer 172 takes on the lattice structure and orientation (in other words, the lattice constant) of the relaxed epitaxial layer 162. Accordingly, a lattice constant of the epitaxial layer 172 varies from the lattice constant of the substrate 110 (in the depicted embodiment, a silicon substrate) by about 0.04 Å to about 0.12 Å. More specifically, the average lattice constant of the epitaxial layer 172 is greater than the average lattice constant of the substrate 110 by about 0.04 Å to about 0.10 Å. Since an intrinsic lattice constant of the epitaxial layer 172 (in the depicted embodiment, the epitaxial silicon layer) is smaller than the actual lattice constant (taken from the underlying, virtual substrate (the relaxed epitaxial layer 162)) of the epitaxial layer 172, strain, specifically tensile strain, is induced in the epitaxial layer 172. The tensile strain of the epitaxial layer 172 induces tensile strain in the channel (in the silicon substrate 110), thereby enhancing electron mobility in the channel.

The seed layer 346, relaxed epitaxial layer 162, and epitaxial layer 172 form a source and drain (S/D) stressor 380, which provides uniaxial stress to the NFET device. More specifically, by forming a "virtual substrate" (relaxed epitaxial layer 162) having a different lattice constant than the substrate (substrate 110), such that the epitaxial layer (epitaxial layer 172) has an intrinsically different lattice constant than its underlying virtual substrate (relaxed epitaxial layer 162), the S/D stressor 380 provides a tensile strained silicon layer (epitaxial layer 172) with a silicon substrate. In the depicted embodiment, the strain level can be enhanced by increasing the germanium concentration of the relaxed epitaxial layer 162 (in other words, the relaxed epitaxial silicon germanium layer (or virtual substrate)), without solubility or dopant deactivation issues arising from conventional epitaxial silicon stressors doped with carbon (Si:C stressors). Because the S/D stressor 380 includes materials used in existing integrated circuit device fabrication process, such as conventional CMOS processes, the process for forming the S/D stressor is easily implemented into existing fabrication processes. The S/D stressor 380 can also be applied in both planar and non-planar devices, such as a FinFET.

The integrated circuit device 300 may include additional features, which may be formed by subsequent processing. For example, implantation, diffusion, and/or annealing processes may be performed to form heavily doped source and drain (HDD) features in the source and drain regions, specifically in the S/D stressor 380. Silicide features may be formed in the source and drain regions, specifically on the S/D stressor 380. The silicide features may be formed by a silicidation process, such as a self-aligned silicide (salicide) process. Various contacts/vias/lines and multilayer interconnect features (e.g., metal layers and interlayer dielectrics) may be formed over the substrate 110, configured to connect the various features or structures of the integrated circuit device 300. The additional features may provide electrical interconnection to the device 300 including the gate structures 220 and 221. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

FIGS. 18-22 provide diagrammatic cross-sectional views of yet another integrated circuit device 400, in portion or entirety, at various stages of fabrication according to the method 10 of FIG. 1. The embodiment of FIGS. 18-22 is similar in many respects to the embodiment of FIGS. 2-7. For example, the integrated circuit device 400 includes a field-effect transistor. Accordingly, similar features in FIGS. 2-7 and 18-22 are identified by the same reference numerals for clarity and simplicity. FIGS. 18-22 have been simplified for the sake of clarity to better understand the inventive concepts of the present disclosure. Additional features can be added in the integrated circuit device 400, and some of the features described below can be replaced or eliminated in other embodiments of the integrated circuit device 400.

Figure 19:
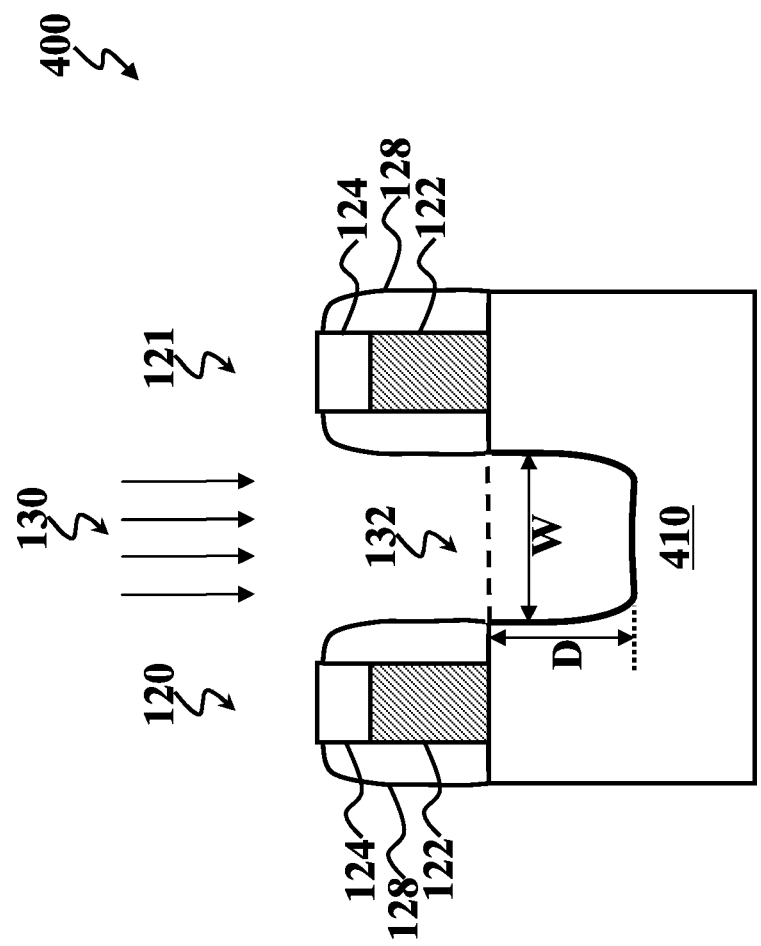

As noted above, the integrated circuit device 400 includes a field-effect transistor. However, in contrast to the integrated circuit device 100 illustrated in FIGS. 2-7, the field-effect transistor of integrated circuit device 400 is a PFET. Accordingly, in FIG. 18, the integrated circuit device 400 includes a substrate 410 that includes germanium, instead of silicon. More specifically, the substrate 410 may be a $Si_xGe_{1-x}$ substrate, where x ranges from 0 to 1, and in the depicted embodiment, x=0. The gate structures 120 and 121 are disposed over the substrate 410, interposing S/D regions, thereby defining channels. The gate structures 120 and 121 each include the gate layer 122, hard mask layer 124, and spacers 128. In FIG. 19, the process 130 forms the trench 132 (having depth, D, and width, W) in the S/D region of the substrate 410, adjacent to and associated with the gate structures 120 and 121.

Figure 20:
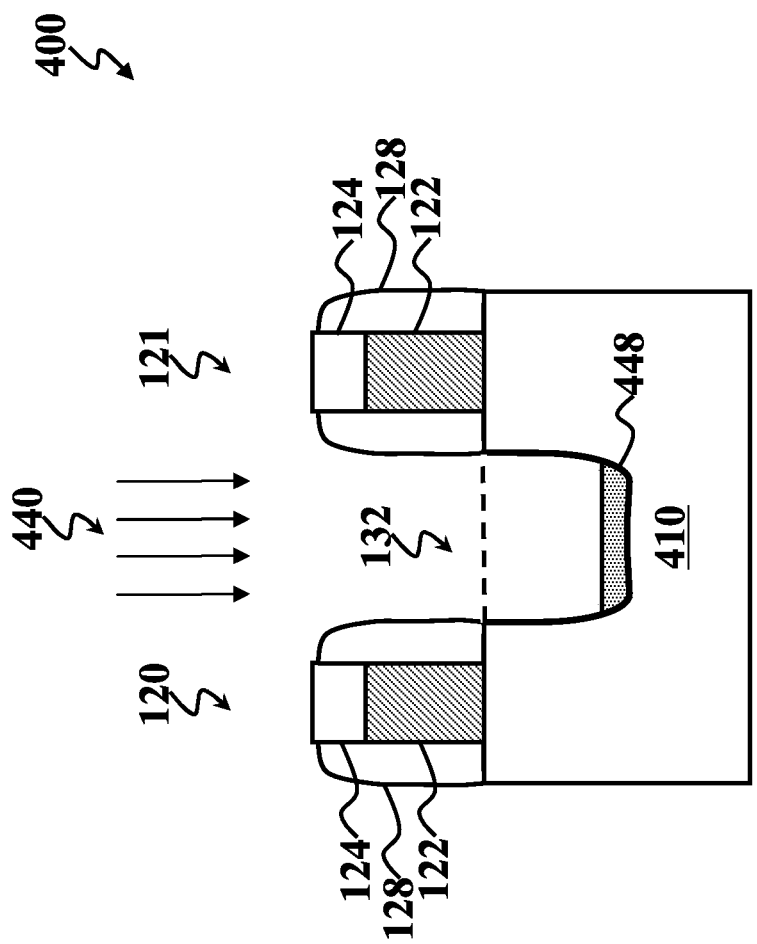

In FIG. 20, a growth process 440 forms a relaxed seed layer 448 over a bottom surface of the trench 132, thereby partially filling the trench 132. The relaxed seed layer 448 is a relatively thin layer, meaning the relaxed seed layer 448 has a thickness less than or equal to about 20 nm. In the depicted embodiment, the growth process 440 is tuned to form a silicon layer that will cause relaxation in a later-grown epitaxial layer. For example, in the depicted embodiment, the relaxed seed layer 448 is a silicon layer that has retained its intrinsic lattice constant, such that the relaxed seed layer 448 is a relaxed silicon seed layer. Various process parameters of the growth process 440 (such as precursor gas, carrier gas, flow rate of the precursor and/or carrier gas, growth time, growth temperature, chamber pressure, other suitable process parameters, or combinations thereof) may be tuned to achieve the relaxed silicon layer. For example, in the depicted embodiment, the growth process 440 uses a silicon-containing precursor gas, such as silane ($SiH_4$), disilane ($Si_2H_6$), trisilane ($Si_3H_8$), dichlorosilane (DCS) ($Si_2H_2Cl_2$), other suitable silicon-containing precursor gases, or combinations thereof; and a carrier gas including He, $N_2$, $H_2$, Ar, other suitable carrier gases, or combinations thereof. In an example, forming the relaxed silicon layer includes using a DCS flow rate of about 50 sccm to about 500 sccm in an $H_2$ carrier gas, in a chamber pressure of about 5 Torr to about 100 Torr for about 50 seconds to about 1,000 minutes. Further, in the depicted embodiment, the growth process 440 uses a suitable growth temperature, for example, a growth temperature of about 650° C. to about 750° C.

In the depicted embodiment, because the lattice constant of the substrate 410 (a germanium substrate) is so much greater than the lattice constant of the relaxed seed layer 448 (a silicon layer), stress between the two materials is so great that the relaxed seed layer 448 retains its intrinsic lattice constant. The relaxed seed layer 448 thus has a different lattice constant than the substrate 410, thereby creating a lattice mismatch between the substrate 410 and relaxed seed layer 448. For example, in the depicted embodiment, an average lattice constant of the relaxed seed layer 448 varies from an average lattice constant of the substrate 410 (in the depicted embodiment, a silicon substrate) by about 0.04 Å to about 0.20 Å. More specifically, the average lattice constant of the relaxed seed layer 448 is less than the average lattice constant of the substrate 410 by about 0.06 Å to about 0.15 Å.

Figure 21:
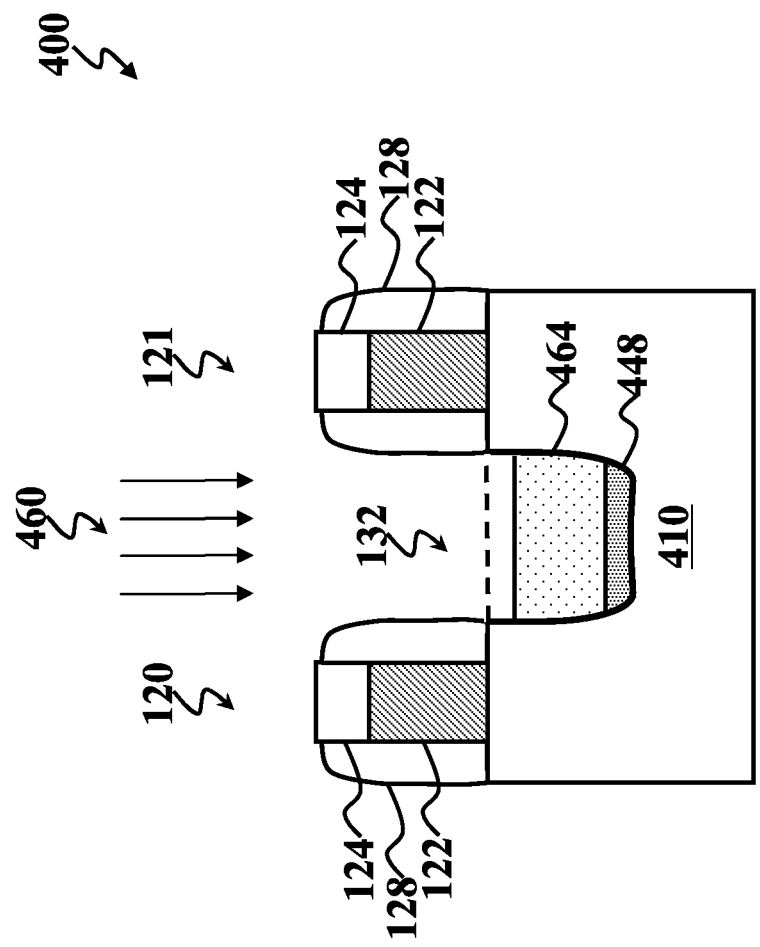

In FIG. 21, an epitaxial growth process 460 forms a relaxed epitaxial layer 464 over the relaxed seed layer 448, thereby partially filling the trench 132. The relaxed epitaxial layer 464 has a thickness of about 40 nm to about 70 nm. In an example, the relaxed epitaxial layer 464 has a thickness of about 30 nm to about 50 nm. In the depicted embodiment, the relaxed epitaxial layer 464 is formed by an epitaxial process that is tuned to generate a silicon germanium layer having a low Ge concentration. For example, in the depicted embodiment, the relaxed epitaxial layer 464 is a silicon germanium layer having a Ge concentration that is about 15% to 40%, and more particularly, from about 15% to about 30%. The relaxed epitaxial layer 464 may have a gradient Ge doping concentration. For example, a Ge concentration at an interface of the relaxed epitaxial layer 464 and the relaxed seed layer 448 may be lower than a Ge concentration at a top surface of the relaxed epitaxial layer 464, where the Ge concentration gradually increases from the interface to the top surface.

The relaxed epitaxial layer 464 is formed by a selective epitaxial growth process, which may use CVD deposition techniques (e.g., LPCVD, APCVD, PECVD, vapor-phase epitaxy (VPE) and/or ultra-high vacuum CVD (UHV-CVD)), molecular beam epitaxy, other suitable techniques, or combinations thereof. The epitaxy process may use gaseous and/or liquid precursors. For example, in the depicted embodiment, a CVD epitaxial growth process uses a silicon-containing precursor gas, such as silane ($SiH_4$), disilane ($Si_2H_6$), trisilane ($Si_3H_8$), dichlorosilane (DCS) ($Si_2H_2Cl_2$), other suitable silicon-containing precursor gases, or combinations thereof; a germanium-containing precursor gas, such as germane ($GeH_4$), digermane ($Ge_2H_6$), germanium tetrachloride ($GeCl_4$), germanium dichloride ($GeCl_2$), other suitable germanium-containing precursor gases, or combinations thereof; and a carrier gas including He, $N_2$, $H_2$, Ar, other suitable carrier gases, or combinations thereof. In an example, forming the silicon germanium layer having the low Ge concentration includes using a DCS flow rate of about 50 sccm to about 500 sccm, a $GeH_4$ flow rate of about 50 sccm to about 300 sccm in an $H_2$ carrier gas, in a chamber pressure of about 5 Torr to about 80 Torr for about 60 seconds to about 600 seconds. Further, in the depicted embodiment, the growth process 460 uses a suitable growth temperature. For example, epitaxial growth process 460 may use a growth temperature of about 630° C. to about 700° C.

Generally, the relaxed epitaxial layer 464 takes on the lattice structure and orientation (in other words, the lattice constant) of the relaxed seed layer 448. However, in the depicted embodiment, since the epitaxial layer 464 is silicon germanium, the relaxed seed layer 448 is silicon, and the thickness of the epitaxial layer 464 is relatively large compared to the thickness of the relaxed seed layer 448, the epitaxial layer 464 substantially retains its intrinsic lattice constant, causing a lattice mismatch between the epitaxial layer 464 and the relaxed seed layer 448. The large lattice mismatch ensures that the epitaxial layer 464 is in a relaxed state, and thus, provides the relaxed epitaxial layer 464. A lattice constant of the relaxed epitaxial layer 464 is different than the lattice constant of the substrate 410. For example, in the depicted embodiment, an average lattice constant of the relaxed epitaxial layer 464 varies from an average lattice constant of the substrate 410 (in the depicted embodiment, a silicon substrate) by about 0.04 Å to about 0.12 Å. More specifically, the average lattice constant of the relaxed epitaxial layer 464 is less than the average lattice constant of the substrate 410 by about 0.04 Å to about 0.10 Å.

Figure 22:
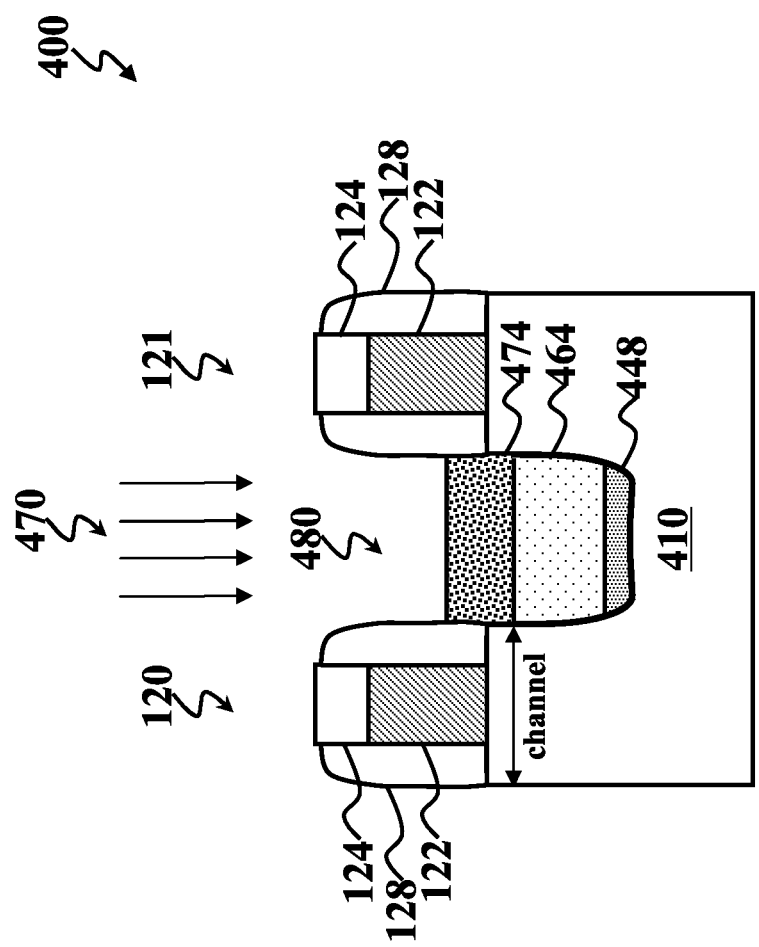

In FIG. 22, an epitaxial growth process 470 forms an epitaxial layer 474 over the relaxed epitaxial layer 464, thereby filling the trench 132. The epitaxial layer 474 has a thickness of about 20 nm to about 70 nm. In an example, the epitaxial layer 474 has a thickness of about 20 nm to about 50 nm. In the depicted embodiment, the epitaxial layer 474 is formed by an epitaxial process that is tuned to generate a silicon germanium layer having a high Ge concentration, specifically a higher Ge concentration than the relaxed epitaxial layer 464. For example, in the depicted embodiment, the epitaxial layer 474 is a silicon germanium layer having a Ge concentration that is about 35% to 70%. The epitaxial layer 474 may have a gradient Ge doping concentration. For example, a Ge concentration at an interface of the epitaxial layer 474 and the relaxed epitaxial layer 464 may be lower than a Ge concentration at a top surface of the epitaxial layer 474, where the Ge concentration gradually increases from the interface to the top surface. In an example, the epitaxial layer 474 has a gradient Ge profile, where the Ge concentration ranges from 35% to 70%, with 35% Ge concentration at the interface of the epitaxial layer 474 and the relaxed epitaxial layer 464, and 70% Ge concentration at the top surface of the epitaxial layer 474.

The epitaxial layer 474 is formed by a selective epitaxial growth process, which may use CVD deposition techniques (e.g., LPCVD, APCVD, PECVD, vapor-phase epitaxy (VPE) and/or ultra-high vacuum CVD (UHV-CVD)), molecular beam epitaxy, other suitable techniques, or combinations thereof. The epitaxy process may use gaseous and/or liquid precursors. For example, in the depicted embodiment, a CVD epitaxial growth process uses a silicon-containing precursor gas, such as silane ($SiH_4$), disilane ($Si_2H_6$), trisilane ($Si_3H_8$), dichlorosilane (DCS) ($Si_2H_2Cl_2$), other suitable silicon-containing precursor gases, or combinations thereof; a germanium-containing precursor gas, such as germane ($GeH_4$), digermane ($Ge_2H_6$), germanium tetrachloride ($GeCl_4$), germanium dichloride ($GeCl_2$), other suitable germanium-containing precursor gases, or combinations thereof; and a carrier gas including He, $N_2$, $H_2$, Ar, other suitable carrier gases, or combinations thereof. In an example, forming the silicon germanium layer having the high Ge concentration includes using a DCS flow rate of about 30 sccm to about 300 sccm, a $GeH_4$ flow rate of about 100 sccm to about 1,000 sccm in a $H_2$ carrier gas, in a chamber pressure of about 10 Torr to about 200 Torr for about 60 seconds to about 30 minutes. Further, in the depicted embodiment, the growth process 470 uses a suitable growth temperature. For example, epitaxial growth process 470 may use a growth temperature of about 530° C. to about 630° C.

Generally, the epitaxial layer 474 takes on the lattice structure and orientation (in other words, the lattice constant) of the relaxed epitaxial layer 464. However, since the epitaxial layer 474 has a higher Ge concentration than the relaxed epitaxial layer 464, the epitaxial layer 474 has a lattice constant different and higher than the relaxed epitaxial layer 464, while still remaining different and smaller than the lattice constant of the substrate 410. For example, in the depicted embodiment, an average lattice constant of the epitaxial layer 474 varies from the average lattice constant of the substrate 410 (in the depicted embodiment, a germanium substrate) by about 0.06 Å to about 0.14 Å. More specifically, the average lattice constant of the epitaxial layer 474 is less than the average lattice constant of the substrate 410 by about 0.08 Å to about 0.12 Å. Since an intrinsic lattice constant of the epitaxial layer 474 (in the depicted embodiment, the epitaxial silicon germanium layer having the high germanium concentration) is smaller than the actual lattice constant (taken from the underlying, virtual substrate (the relaxed epitaxial layer 464)) of the epitaxial layer 474, strain, specifically compressive strain, is induced in the epitaxial layer 474. The compressive strain of the epitaxial layer 474 induces compressive strain in the channel (in the germanium substrate 410), thereby enhancing electron mobility in the channel.

The seed layer 448, relaxed epitaxial layer 464, and epitaxial layer 474 form a source and drain (S/D) stressor 480, which provides uniaxial stress to the PFET device. More specifically, by forming a "virtual substrate" (relaxed epitaxial layer 464) having a different lattice constant than the substrate (substrate 410), such that the epitaxial layer (epitaxial layer 474) has an intrinsically different lattice constant than its underlying virtual substrate (relaxed epitaxial layer 464), the S/D stressor 480 provides a compressive strained silicon germanium layer (epitaxial layer 474) with a germanium substrate. In the depicted embodiment, the strain level can be enhanced by increasing the germanium concentration of the epitaxial layer 474 (the relaxed epitaxial silicon germanium layer (virtual substrate)). Because the S/D stressor 480 includes materials used in existing integrated circuit device fabrication process, such as conventional CMOS processes, the process for forming the S/D stressor is easily implemented into existing fabrication processes. The S/D stressor 480 can also be applied in both planar and non-planar devices, such as a FinFET.

The integrated circuit device 400 may include additional features, which may be formed by subsequent processing. For example, implantation, diffusion, and/or annealing processes may be performed to form heavily doped source and drain (HDD) features in the source and drain regions, specifically in the S/D stressor 480. Silicide features may be formed in the source and drain regions, specifically on the S/D stressor 480. The silicide features may be formed by a silicidation process, such as a self-aligned silicide (salicide) process. Various contacts/vias/lines and multilayer interconnect features (e.g., metal layers and interlayer dielectrics) may be formed over the substrate 410, configured to connect the various features or structures of the integrated circuit device 400. The additional features may provide electrical interconnection to the device 400 including the gate structures 220 and 221. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Thus, the present disclosure provides integrated circuit devices that can exhibit maximized strain to their channels, and methods for fabricating the integrated circuit devices with maximized strain. Maximized strain can be achieved by forming a virtual substrate with existing integrated circuit manufacturing materials. It is noted that the FETs in integrated circuit devices 100, 200, 300, and/or 400 can be fabricated in a single integrated circuit device. Though various advantages of the integrated circuit devices are described above, different embodiments may have different advantages, and that no particular advantage is necessarily required of any embodiment.

The present disclosure provides for many different embodiments. For example, the present disclosure provides various source/drain stressors that can enhance carrier mobility and methods for fabricating such source/drain stressors. In an embodiment, a semiconductor device includes a substrate of a first material; a gate stack disposed over the substrate, the gate stack interposing a source region and a drain region of the substrate; and a strained feature formed in the substrate in the source and drain regions. The strained feature includes a seed layer of a second material disposed over the substrate, the second material being different than the first material; a relaxed epitaxial layer disposed over the seed layer; and an epitaxial layer disposed over the relaxed epitaxial layer. A lattice constant of the seed layer may vary from a lattice constant of the substrate by about 0.06 Å to about 0.20 Å. A lattice constant of the relaxed epitaxial layer may vary from a lattice constant of the substrate by about 0.04 Å to about 0.12 Å. A lattice constant of the epitaxial layer may be substantially the same as the lattice constant of the relaxed epitaxial layer.

In an example, the substrate is a silicon substrate; the relaxed epitaxial layer is a relaxed silicon germanium epitaxial layer; and the epitaxial layer is a silicon epitaxial layer. The seed layer may be a relaxed silicon germanium layer having a germanium concentration that is greater than a germanium concentration of the relaxed epitaxial silicon germanium layer. The germanium concentration of the relaxed epitaxial silicon germanium layer may be at least 10% less than the germanium concentration of the relaxed silicon germanium layer. The seed layer may be a silicon carbon layer. A carbon concentration of the silicon carbon layer may be about 2% to about 5%. The seed layer may be a carbon coherence breaking layer.

In another example, the substrate is a germanium substrate; the seed layer is a relaxed silicon layer; the relaxed epitaxial layer is a relaxed silicon germanium epitaxial layer having a first germanium concentration; and the epitaxial layer is a silicon germanium epitaxial layer having a second germanium concentration that is higher than the first germanium concentration. The first germanium concentration may be about 20% to about 40%, and the second germanium concentration may be about 35% to about 70%.

In another embodiment, a device includes a substrate having a first lattice constant (a1); and a strained feature formed in the substrate. The strained feature includes a seed layer disposed over the substrate, the seed layer having a second lattice constant (a2) that is different than the first lattice constant (a1) of the substrate; a first epitaxial layer disposed over the seed layer, the first epitaxial layer having a third lattice constant (a3) that is different than the first lattice constant (a1) of the substrate; and a second epitaxial layer disposed over the first epitaxial layer, the second epitaxial layer having a fourth lattice constant (a4) that is different from the first lattice constant (a1) of the substrate. In an example, a2>a3>a4>a1. The first epitaxial layer may be a silicon germanium layer having a gradient germanium profile. In an example, the substrate is a silicon substrate; the seed layer is a silicon germanium seed layer having a first germanium concentration; the first epitaxial layer is a silicon germanium epitaxial layer having a second germanium concentration that is less than the first germanium concentration; and the second epitaxial layer is a silicon-containing epitaxial layer. The second germanium concentration may be at least 10% less than the first germanium concentration. The silicon germanium seed layer may be an epitaxially grown silicon germanium seed layer.

In yet another embodiment, a method for forming the devices described herein includes providing a substrate of a first material; forming a trench in the substrate; forming a seed layer of a second material over the substrate in the trench, the second material being different than the first material; forming a relaxed epitaxial layer over the seed layer in the trench; and forming an epitaxial layer over the relaxed epitaxial layer in the trench. In an example, the providing the substrate of a first material includes providing a silicon substrate; and the forming the seed layer of the second material over the substrate in the trench includes growing one of a relaxed silicon germanium layer, a silicon carbon layer, and a carbon coherence breaking layer. Forming the seed layer may include performing an annealing process after growing one of the relaxed silicon germanium layer, silicon carbon layer, and carbon coherence breaking layer. In an example, the growing the relaxed silicon germanium layer may include tuning a growth process such that the relaxed silicon germanium layer has a germanium concentration greater than or equal to about 40%. In another example, the growing the silicon carbon layer may include tuning a growth process such that the silicon carbon layer has a carbon concentration of about 2% to about 5%. In yet another example, the growing the carbon coherence breaking layer may include tuning a growth process such that a layer of carbon clusters is formed. Tuning the growth process such that a layer of carbon clusters is formed may include using a carbon-containing precursor gas including mono-methyl-silane ($SiH_3(CH_3)$) at a flow rate of about 50 sccm to about 500 sccm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
providing a substrate;
forming a trench in the substrate;
forming a silicon carbon layer over the substrate in the trench;
forming a relaxed silicon germanium epitaxial layer over the silicon carbon layer in the trench; and forming a silicon-containing epitaxial layer over the relaxed silicon germanium epitaxial layer in the trench.

2. The method of claim 1 wherein forming the silicon carbon layer comprises forming the silicon carbon layer with a lattice constant that varies from a lattice constant of the substrate by about 0.06 Å to about 0.20 Å.

3. The method of claim 1 wherein forming the relaxed silicon germanium epitaxial layer comprises forming the relaxed silicon germanium epitaxial layer with a lattice constant that varies from a lattice constant of the substrate by about 0.04 Å to about 0.12 Å.

4. The method of claim 3 wherein forming the silicon-containing epitaxial layer comprises forming the silicon-containing epitaxial layer with a lattice constant that is substantially the same as the lattice constant of the relaxed silicon germanium epitaxial layer.

5. The method of claim 1 wherein the substrate is selected from a group consisting of a silicon substrate and a germanium substrate.

6. The semiconductor device of claim 1 wherein forming the silicon carbon layer comprises forming the silicon carbon layer with a carbon concentration of about 2% to about 5%.

7. The method of claim 1 wherein:
forming the relaxed silicon germanium epitaxial layer comprises forming the silicon germanium epitaxial layer with a first germanium concentration; and
forming the silicon-containing epitaxial layer comprises forming the silicon-containing epitaxial layer with a second germanium concentration that is higher than the first germanium concentration.

8. The method of claim 7 wherein the first germanium concentration is about 20% to about 40% and the second germanium concentration is about 35% to about 70%.

9. The method of claim 1 wherein forming the silicon carbon layer comprises:
growing the silicon carbon layer; and
performing an annealing process after growing the silicon carbon layer.

10. The semiconductor device of claim 9 wherein the growing the silicon carbon layer includes tuning a growth process such that the silicon carbon layer has a carbon concentration of about 2% to about 5%.

11. A method comprising:
providing a substrate;
forming a trench in the substrate;
forming a first layer from the group consisting of a silicon carbon layer and a carbon coherence breaking layer over the substrate in the trench;
forming a relaxed silicon germanium epitaxial layer over the first-layer in the trench; and
forming a silicon-containing epitaxial layer over the relaxed silicon germanium epitaxial layer in the trench.

12. The method of claim 11 wherein the first layer is the carbon coherence breaking layer.

13. The method of claim 12 wherein forming the relaxed silicon germanium epitaxial layer comprises forming the relaxed silicon germanium epitaxial layer with a lattice constant that varies from a lattice constant of the substrate by about 0.04 Å to about 0.12 Å.

14. The method of claim 13 wherein forming the silicon-containing epitaxial layer comprises forming the silicon-containing epitaxial layer with a lattice constant that is substantially the same as the lattice constant of the relaxed silicon germanium epitaxial layer.

15. The method of claim 12 wherein:
forming the relaxed silicon germanium epitaxial layer comprises forming the silicon germanium epitaxial layer with a first germanium concentration; and
forming the silicon-containing epitaxial layer comprises forming the silicon-containing epitaxial layer with a second germanium concentration that is higher than the first germanium concentration.

16. The method of claim 15 wherein the first germanium concentration is about 20% to about 40% and the second germanium concentration is about 35% to about 70%.

17. The method of claim 12 wherein forming the carbon coherence breaking layer comprises:
growing the carbon coherence breaking layer; and
performing an annealing process after growing the carbon coherence breaking layer.

18. The method of claim 12 wherein growing the carbon coherence breaking layer comprises tuning a growth process such that a layer of carbon clusters is formed.

19. The method of claim 18 wherein tuning the growth process such that the layer of carbon clusters is formed comprises using a carbon-containing precursor gas including monomethylsilane ($SiH_3(CH_3)$) at a flow rate of about 50 sccm to about 500 sccm.

20. The method of claim 12 wherein forming the carbon coherence breaking layer comprises forming the carbon coherence breaking layer with a lattice constant that varies from a lattice constant of the substrate by about 0.06 Å to about 0.20 Å.

* * * * *